US 12,238,195 B2

(12) United States Patent
Kim et al.

(10) Patent No.: US 12,238,195 B2
(45) Date of Patent: Feb. 25, 2025

(54) RECEIVER CIRCUITS

(71) Applicant: Samsung Electronics Co., Ltd., Suwon-si (KR)

(72) Inventors: Taejin Kim, Hwaseong-si (KR); Seongyoung Ryu, Seoul (KR); Soojoo Lee, Bucheon-si (KR); Sengsub Chun, Seoul (KR); Hyunwoo Cho, Suwon-si (KR); Jongil Hwang, Hanam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 18/059,522

(22) Filed: Nov. 29, 2022

(65) Prior Publication Data
US 2023/0179394 A1 Jun. 8, 2023

(30) Foreign Application Priority Data

Dec. 2, 2021 (KR) .................. 10-2021-0170542
Mar. 2, 2022 (KR) .................. 10-2022-0026568

(51) Int. Cl.
*H04L 7/00* (2006.01)
*G06F 1/08* (2006.01)
(Continued)

(52) U.S. Cl.
CPC .............. *H04L 7/0079* (2013.01); *G06F 1/08* (2013.01); *G09G 5/006* (2013.01); *H04L 7/0008* (2013.01); *H03K 19/20* (2013.01)

(58) Field of Classification Search
CPC ..... H04L 7/0079; H04L 7/0008; G09G 5/006; G09G 5/008; G09G 2370/08;
(Continued)

(56) References Cited

U.S. PATENT DOCUMENTS 7,424,628 B2   9/2008  Matsumoto et al.
7,852,168 B1 * 12/2010  Song .................. H03L 7/099
                                                        331/185

(Continued)

FOREIGN PATENT DOCUMENTS

KR        101541182 B1    8/2015
WO    WO-2020/239102 A1  12/2020

*Primary Examiner* — Betsy Deppe
(74) *Attorney, Agent, or Firm* — Harness, Dickey & Pierce, P.L.C.

(57) ABSTRACT

A receiver circuit includes data lane modules, a clock lane module, a bias current controller and a link layer. Each of the data lane modules receive respective data signals. The clock lane module receives clock signals and provides each of the data lane modules with a respective divided clock signal among divided clock signals. The bias current controller controls a clock bias current. The link layer provides a bias control signal to the bias current controller and provides clock gating signals to the clock lane module, based on low power data signals and low power clock signals. The bias current controller, based on the bias control signal, provides the clock bias current having a first magnitude to the clock lane module in a second power mode and provides the clock bias current having a second magnitude to the clock lane module in a third power mode.

20 Claims, 19 Drawing Sheets

(51) Int. Cl.
*G09G 5/00* (2006.01)
*H03K 19/20* (2006.01)

(58) Field of Classification Search
CPC ........... G09G 2370/10; G09G 2370/14; G09G 3/2092; G09G 3/2096; G06F 1/06; G06F 1/08; G06F 1/10; G06F 1/32; G06F 1/3203; G06F 1/3234; G06F 1/3237
See application file for complete search history.

(56) References Cited

U.S. PATENT DOCUMENTS

| | | |
|---|---|---|
| 9,892,483 B2 | 2/2018 | Lee et al. |
| 9,940,869 B2 | 4/2018 | Nose |
| 10,027,504 B2 * | 7/2018 | Wiley ............... H04L 12/40032 |
| 10,074,339 B2 * | 9/2018 | Higashino .............. G09G 5/006 |
| 11,023,409 B2 | 6/2021 | Ahmed et al. |
| 11,063,737 B2 * | 7/2021 | Takahashi ............. H04L 7/0079 |
| 11,112,818 B2 * | 9/2021 | Kim ...................... H04L 7/0008 |

* cited by examiner

RECEIVER CIRCUITS

CROSS-REFERENCE TO RELATED APPLICATIONS

This US application claims the benefit of priority under 35 USC § 119 to Korean Patent Application No. 10-2021-0170542, filed on Dec. 2, 2021, in the Korean Intellectual Property Office, and to Korean Patent Application No. 10-2022-0026568, filed on Mar. 2, 2022, in the Korean Intellectual Property Office, the disclosures of which are incorporated by reference herein in their entirety.

BACKGROUND

1. Technical Field

Example embodiments generally relate to receiver circuits, and more particularly to receiver circuits based on a mobile industry processor interface (MIPI) protocol.

2. Discussion of the Related Art

Nowadays, various types of electronic devices are being used. The electronic device may perform a unique function and/or functions based on operations of various electronic circuits included therein. The electronic device may operate independently or while communicating with another electronic device. The electronic device may adopt an interface protocol for the purpose of communicating with the other electronic device.

For example, a transmission device may transmit a signal to a reception device in compliance with the interface protocol. The reception device may obtain data corresponding to the received signal by processing the received signal. Accordingly, to exchange data with each other, the transmission device and the reception device may communicate with each other in compliance with the interface protocol. A power mode of the reception device may be changed based on the received signal. When the power mode of the reception device is changed, power consumption of the reception device may be increased.

SUMMARY

Some example embodiments may provide a receiver circuit capable of reducing power consumption in case of a power mode being changed.

According to some example embodiments, a receiver circuit includes a plurality of data lane modules, a clock lane module, a bias current controller and a link layer. Each of the plurality of data lane modules receive respective data signals. The clock lane module receives clock signals and provides each of the plurality of data lane modules with a respective divided clock signal among divided clock signals based on the clock signals. The bias current controller controls a clock bias current provided to the clock lane module. The link layer provides a bias control signal to the bias current controller and provides clock gating signals to the clock lane module, based on levels of low power data signals output from the plurality of data lane modules and low power clock signals output from the clock lane module. The bias current controller, based on the bias control signal, cuts off the clock bias current in a first power mode, provides the clock bias current having a first magnitude to the clock lane module in a second power mode and provides the clock bias current having a second magnitude greater than the first magnitude to the clock lane module in a third power mode.

According to some example embodiments, a receiver circuit includes a plurality of trio modules, a bias current controller and a link layer. Each of the trio modules receives three or more signals. The bias current controller controls a bias current provided to each of the plurality of trio modules. The link layer provides a bias control signal to the bias current controller based on levels of low power signals output from the plurality of trio modules. The bias current controller, based on the bias control signal, cut offs the bias current in a first power mode, outputs the bias current having a first magnitude in a second power mode and outputs the bias current having a second magnitude in a third power mode.

According to some example embodiments, a receiver circuit includes a plurality of data lane modules, a clock lane module, a bias current controller and a link layer. Each of the plurality of data lane modules receive respective data signals. The clock lane module receives clock signals and provides each of the plurality of data lane modules with a respective divided clock signal among divided clock signals based on the clock signals. The bias current controller controls a clock bias current provided to the clock lane module. The link layer provides a bias control signal to the bias current controller and provides clock gating signals to the clock lane module, based on a power mode of the clock lane module and the plurality of data lane modules. The power mode is determined based on levels of low power data signals output from the plurality of data lane modules and low power clock signals output from the clock lane module. The bias current controller, based on the bias control signal, cuts off the clock bias current in a first power mode, provides the clock bias current having a first magnitude to the clock lane module in a second power mode and provides the clock bias current having a second magnitude greater than the first magnitude to the clock lane module in a third power mode. The clock lane module gate the divided clock signals provided to the plurality of data lane modules based on the clock gating signals, in the second power mode. The clock lane module operates in a high speed mode and the plurality of data lane modules operate in a low power mode, in the second power mode.

Therefore, the receiver circuit or the electronic device conforming to MIPI D-PHY protocol, in a second power mode in which only a clock lane module operates in a high speed mode, provides a clock bias current having a first magnitude to a high speed receiver in the clock lane module and gates high speed clock signals provided to high speed receivers in data lane modules and in a third power mode in which the clock lane module and the data lane modules operate in the high speed mode, provides the clock bias current having a second magnitude greater than the first magnitude to the high speed receiver in the clock lane module and provides the high speed receivers in the data lane modules a data bias current having a third magnitude which is the same as the second magnitude. Accordingly, the receiver circuit or the electronic device may reduce power consumption in the second power mode and reduce a skew between the clock lane module and the data lane modules.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various example embodiments will be described more fully hereinafter with reference to the accompanying drawings, in which some example embodiments are shown.

Figure 1:
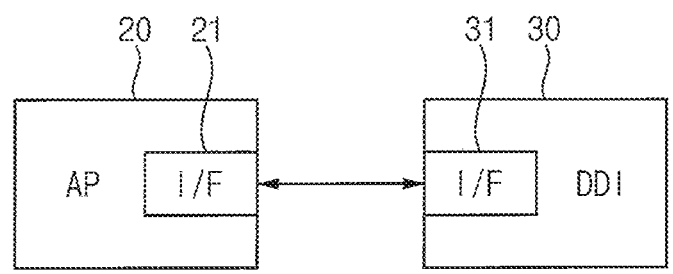
FIGS. 1 and 2 are schematic diagrams illustrating an electronic device including an interface circuit according to some example embodiments.
Figure 2:
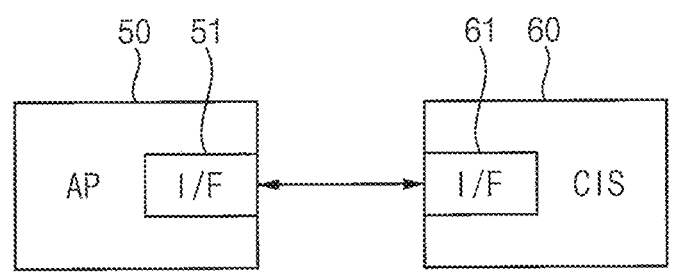

FIGS. 1 and 2 are schematic diagrams illustrating an electronic device including an interface circuit according to some example embodiments.

Referring to FIG. 1, an electronic device 10 may include an application processor (AP) 20 and a display driver integrated circuit (DDI) 30.

An interface circuit I/F 21 of the AP 20 may exchange data with an interface circuit I/F 31 of the DDI 30.

The interface circuits 21 and 31 may exchange data with each other according to a predetermined or alternatively, desired protocol. As an example, the interface circuit 21 of the AP 20 and the interface circuit 31 of the DDI 30 may exchange data according to a protocol defined in a mobile industry processor interface (MIPI) standard. Each of (or at least one of) the interface circuits 21 and 31 may include a transmission circuit and a reception circuit.

Referring to FIG. 2, in an electronic device 40, an AP 50 may exchange data with an image sensor CIS 60. An interface circuit I/F 51 of the AP 50 and an interface circuit I/F 61 of the image sensor 60 may exchange data with each other. Similarly to what is described with reference to FIG. 1, each of (or at least one of) the interface circuits I/F 51 and 61 may include a transmission circuit and a reception circuit for data exchange.

Figure 3:
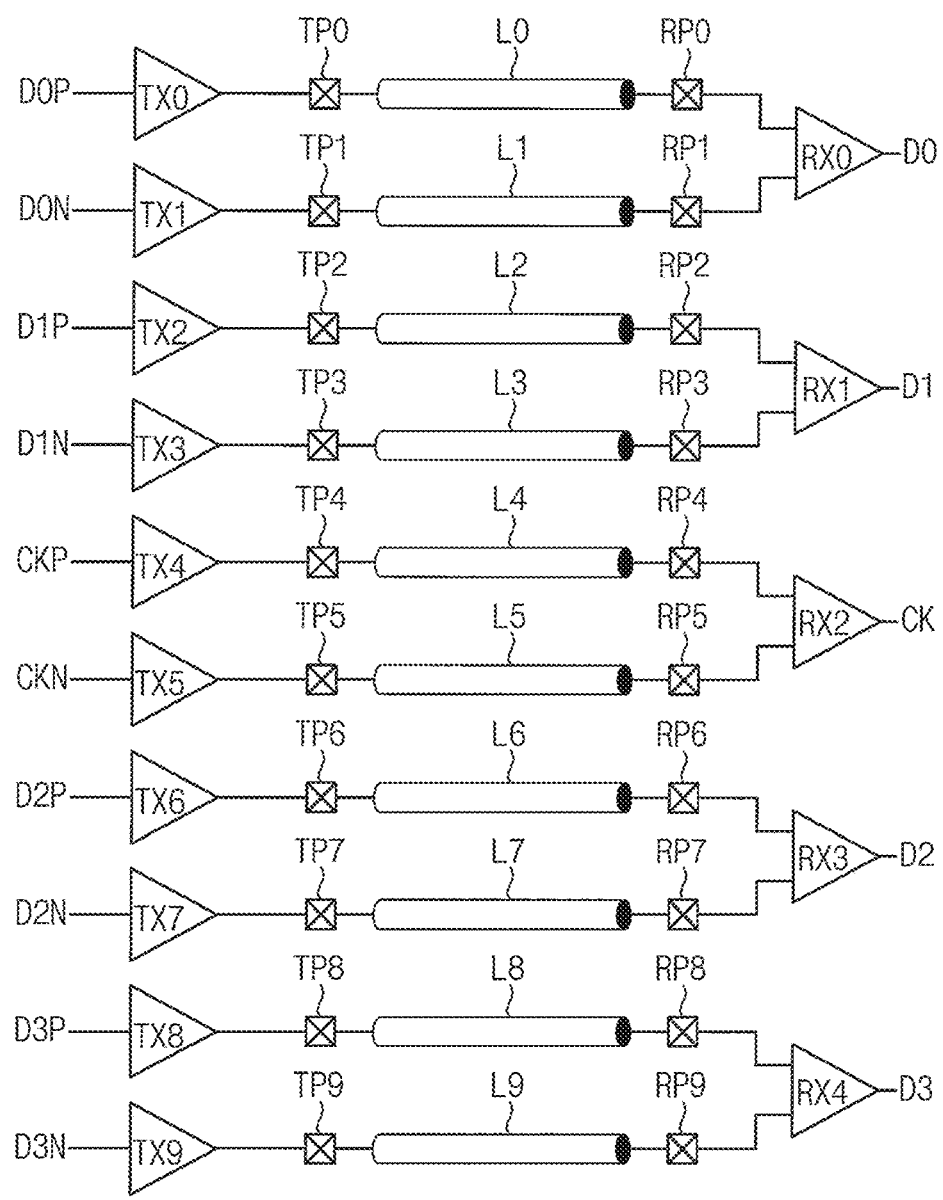
FIGS. 3 and 4 are views illustrating an operation of an interface circuit according to some example embodiments.
Figure 4:
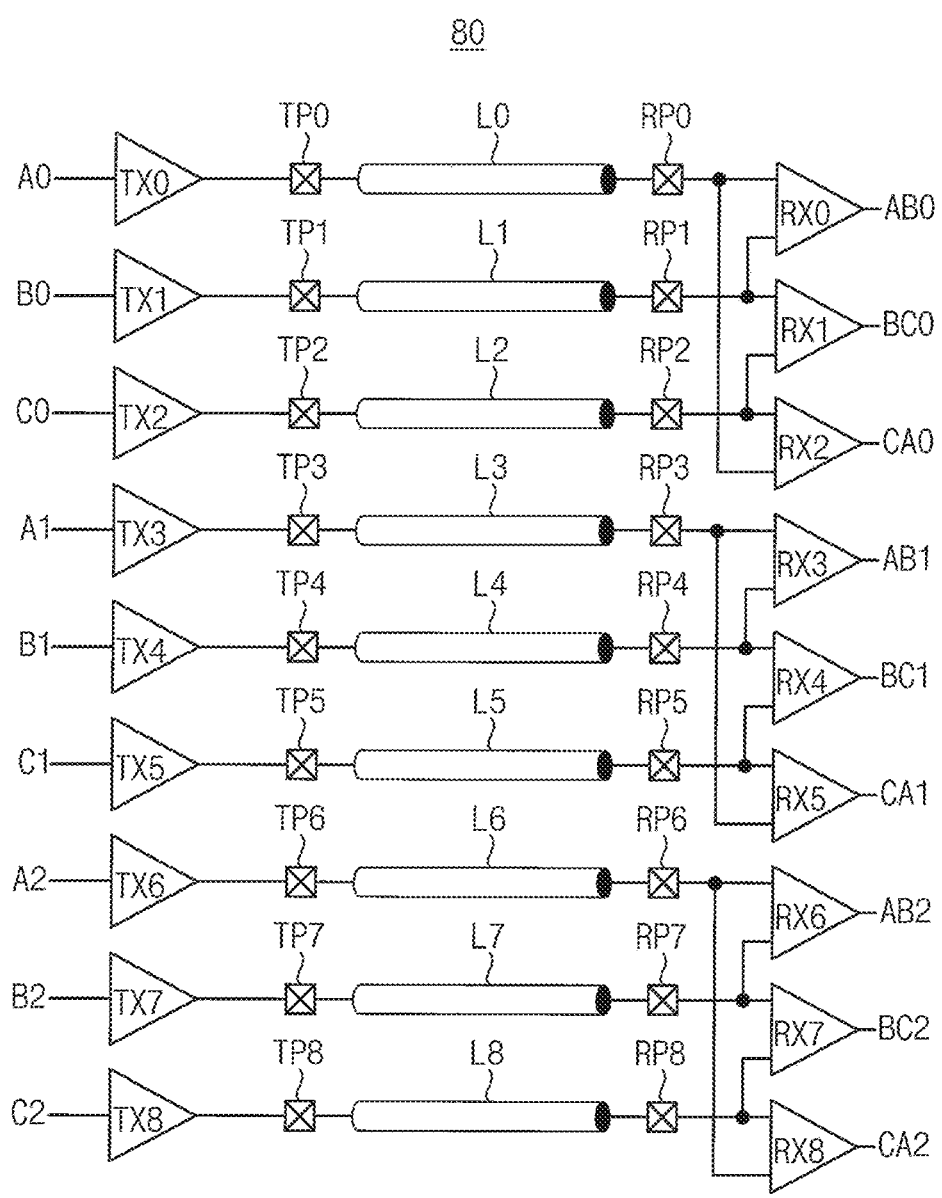

FIGS. 3 and 4 are views illustrating an operation of an interface circuit according to some example embodiments.

FIG. 3 may be a view illustrating an operation of an interface circuit 70 transmitting data and clock signals in a differential signaling scheme. For example, example embodiments described with reference to FIG. 3 may be applied to a D-PHY interface according to the MIPI standard.

Referring to FIG. 3, a plurality of transmitters TX0 to TX9 may output pieces of data D0P to D3P3 and D0N to D3N and clock signals CKP and CKP through a plurality of transmission pads TP0 to TP9.

The transmission pads TP0 to TP9 may be connected to a plurality of reception pads RP0 to RP9 through a plurality of data lanes L0 to L9, and the reception pads RP0 to RP9 may be connected to a plurality of receivers RX0 to RX4. For example, each of (or at least one of) the receivers RX0 to RX4 may be connected to a pair of reception pads, among the reception pads RP0 to RP9, and the receivers RX0 to RX4 may generate pieces of data D0 to D3 and a clock signal CK in the differential signaling scheme.

Therefore, in example embodiments s illustrated in FIG. 3, ten transmission pads TP0 to TP9, ten data lines L0 to L9, and ten reception pads RP0 to RP9 may be required to transmit data in the differential signaling scheme. According to some example embodiments, dummy pads may be added to the transmission pads TP0 to TP9 and the reception pads RP0 to RP9 to achieve an electrical shielding effect.

As an example, the interface circuit 70 illustrated in FIG. 3 may be applied to an AP, a DDI, an image sensor, and/or the like.

FIG. 4 may be a view illustrating an operation of an interface circuit 80 transmitting data in a single-ended signaling scheme. For example, some example embodiments described with reference to FIG. 4 may be applied to a C-PHY interface according to the MIPI standard.

Figure 5:
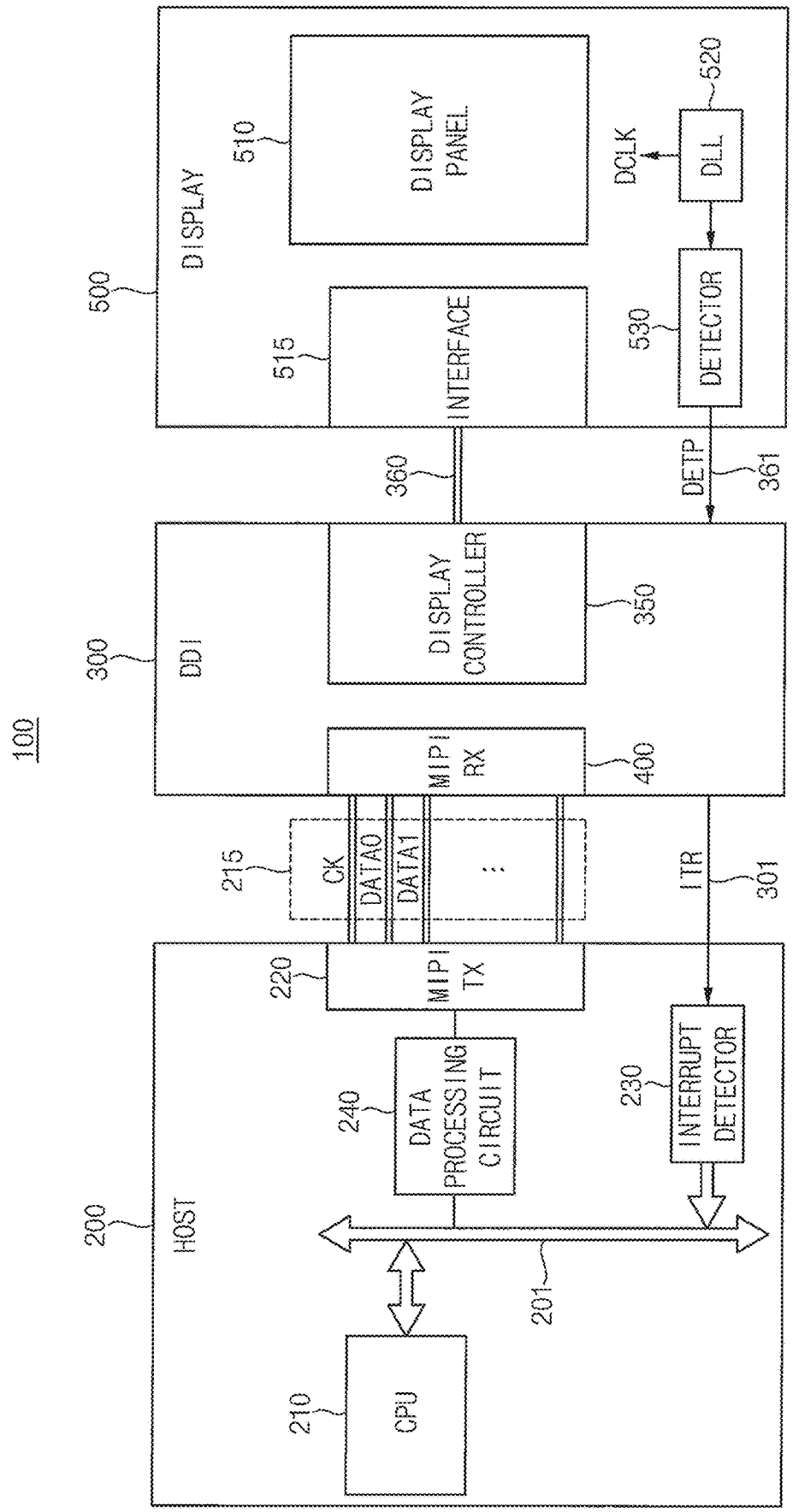
FIG. 5 is a block diagram of a display system according to some example embodiments.

Referring to FIG. 5, a plurality of transmitters TX0 to TX8 may output pieces of data A0 to C0, A1 to C1, and A2 to C2 through a plurality of transmission pads TP0 to TP8. Since image data is output in the single-ended signaling scheme, an additional data lane for outputting a clock signal may not be present in an interface according to some example embodiments illustrated in FIG. 4.

The transmission pads TP0 to TP8 may be connected to a plurality of reception pads RP0 to RP8 through a plurality of data lanes L0 to L8, and the reception pads RP0 to RP8 may be connected to a plurality of receivers RX0 to RX8. According to the pieces of data A0 to C0, A1 to C1, and A2 to C2, the transmission pads TP0 to TP8 may be divided into a plurality of groups TP0 to TP2, TP3 to TP5, and TP6 to TP8, and the reception pads RP0 to RP8 may also be divided into a plurality of groups RP0 to RP2, RP3 to RP5, and RP6 to RP8.

Each of (or at least one of) the receivers RX0 to RX8 may receive a pair of reception pads RP0 to RP8, among the reception pads RP0 to RP8 included in each of (or at least one of) the groups RP0 to RP2, RP3 to RP5, and RP6 to RP8. As an example, the first receiver RX0 may output a difference between a signal A0 and a signal B0, and the second receiver RX1 may output a difference between the signal B0 and a signal C0. The third receiver RX2 may output a difference between the signal C0 and the signal A0.

In example embodiments illustrated in FIG. 4, nine transmission pads TP0 to TP8, nine data lanes L0 to L8, and nine reception pads RP0 to RP8 may be required to transmit data in the single-ended signaling scheme. However, even in the single-ended signaling scheme, dummy pads may be added to achieve an electrical shielding effect according to some example embodiments. The interface circuit 80, illustrated in FIG. 4, may also be applied to an AP, a DDI, an image sensor, and/or the like.

The interface circuits 70 and 80 according to some example embodiments described with reference to FIGS. 3 and 4 may also be applied to communications between devices, other than an AP, a DDI and an image sensor. As an example, the interface circuits 70 and 80 may be applied to interfaces such as peripheral component interconnect (PCI)-Express, universal serial bus (USB), display ports, and/or the like.

Each of (or at least one of) the transmission pads TP0 to TP8 may be referred to as a transmission terminal and each of (or at least one of) the reception pads RP0 to RP8 may be referred to as a reception terminal.

Figure 6:
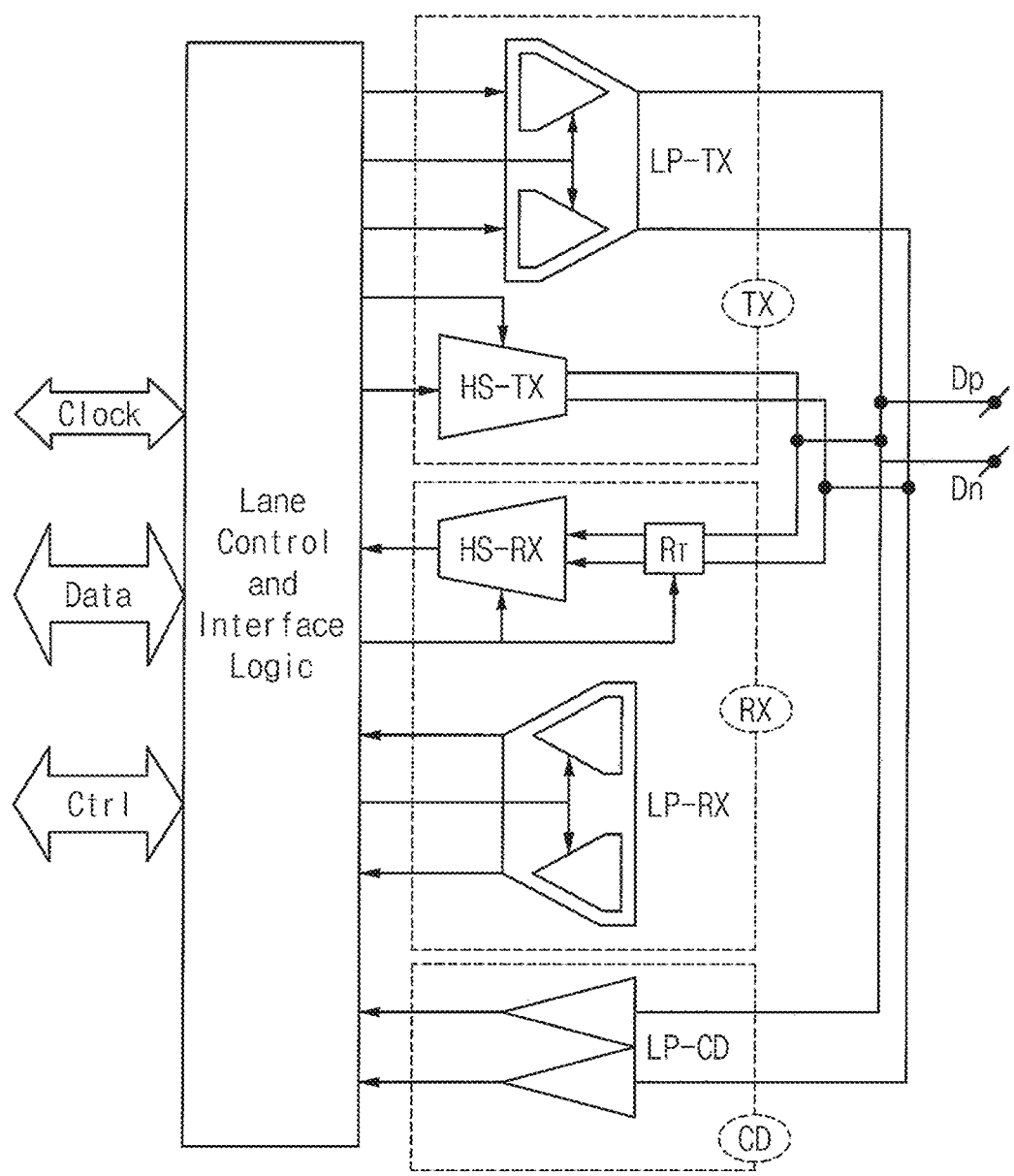
FIG. 6 is a diagram illustrating universal lane module functions of a MIPI.

FIG. 5 is a block diagram of a display system according to some example embodiments and FIG. 6 is a diagram illustrating universal lane module functions of a MIPI.

Referring to FIG. 5, a display system 100 includes a host 200, a DDI 300, and a display 500. The display system 100 may be implemented with a mobile device capable of using a MIPI or a MIPI protocol.

The mobile device may be, for example, a mobile device such as a mobile phone, a smart phone, a tablet personal computer (PC), a personal digital assistant (PDA), an enterprise digital assistant (EDA), a digital still camera, a digital video camera, a portable multimedia player (PMP), a personal navigation device or a portable navigation device (PND), a mobile internet device (MID), a wearable computer, or the like.

The host 200 may control an operation of the DDI 300. The host 200 and the DDI 300 may communicate with each other via a MIPI interface 215. For example, the host 200 may be implemented with an integrated circuit (IC), a system-on-chip (SoC), an AP, or a mobile AP.

In this specification, an MIPI or an MIPI protocol is described as an example embodiment for convenience of explanation, but the technical spirit of the present disclosure (namely, the technique in which information about whether an interface connected between a host and a DDI is normal and/or information about whether the DDI is normal are transmitted to the host) may be applied to display systems including interfaces other than an MIPI and an MIPI protocol.

The host 200 may include a central processing unit (CPU) 210, a MIPI master side transmission interface 220 (hereinafter, referred to as an MIPI TX 220), an interrupt detector 230, and a data processing circuit 240. The CPU 210 may control the MIPI TX 220, the interrupt detector 230, and/or the data processing circuit 240 via a bus 201. The CPU 210 may include one or more cores. The MIPI TX 220 may include one clock lane module and one or more data lane modules.

Each lane module may respectively include interconnections or circuits which function as a high-speed transmitter (HS-TX), a high-speed receiver (HS-RX), a low-power transmitter (LP-TX), a low-power receiver (LP-RX), and a low-power contention detector (LP-CD) as illustrated in FIG. 6.

Referring to FIG. 6, a transmitter TX may include the LP-TX and the HS-TX, a receiver RX may include the HS-RX, the LP-RX, and a termination resistor (or a termination impedance) RT, and a connection detector CD may include the LP-CD. The termination resistor RT may be enabled when each lane module is in an HS reception mode.

A D-PHY transceiver as illustrated in FIG. 6 may be controlled by a lane control and interface logic.

In this present specification, a specification provided by the MIPI Alliance may be referred to as would be understood by one of ordinary skill in the art.

Referring back to FIG. 5, the interrupt detector 230 may receive an interrupt (or interrupt signal) ITR from the DDI 300 via an exclusive (or dedicated) line 301 and may transmit a signal corresponding to the interrupt ITR to the CPU 210 and/or the MIPI TX 220.

The CPU 210 may interpret (or analyze) the signal corresponding to the interrupt ITR, determine a state of the MIPI interface 215 and/or state of the DDI 300 according to a result of the interpretation (or analyzing), and control an operation of the MIPI TX 220 and/or operation of the data processing circuit 240 according to a result of the determination.

The data processing circuit 240 may denote a function circuit capable of processing data (for example, still image data, moving image data, and/or a parameter) that is to be transmitted to the DDI 300 via the MIPI TX 220.

The MIPI interface 215 connected between the host 200 and the DDI 300 may include one clock lane and one or more data lanes. The clock lane may transmit, to the DDI300, a MIPI clock signal CK that has different frequencies and different swing levels according to operation modes (for example, a low power (LP) mode and a high speed (HS) mode). Each data lane may transmit, to the DDI 300, MIPI data signals DATA0, DATA1, . . . and the like that have different frequencies and different swing levels according to the operation modes.

The DDI 300 may include a MIPI slave side reception interface 400 (hereinafter, referred to as a MIPI RX 400) and a display controller 350. A structure and an operation of the DDI 300 will be described in detail with reference to FIG. 7.

Figure 7:
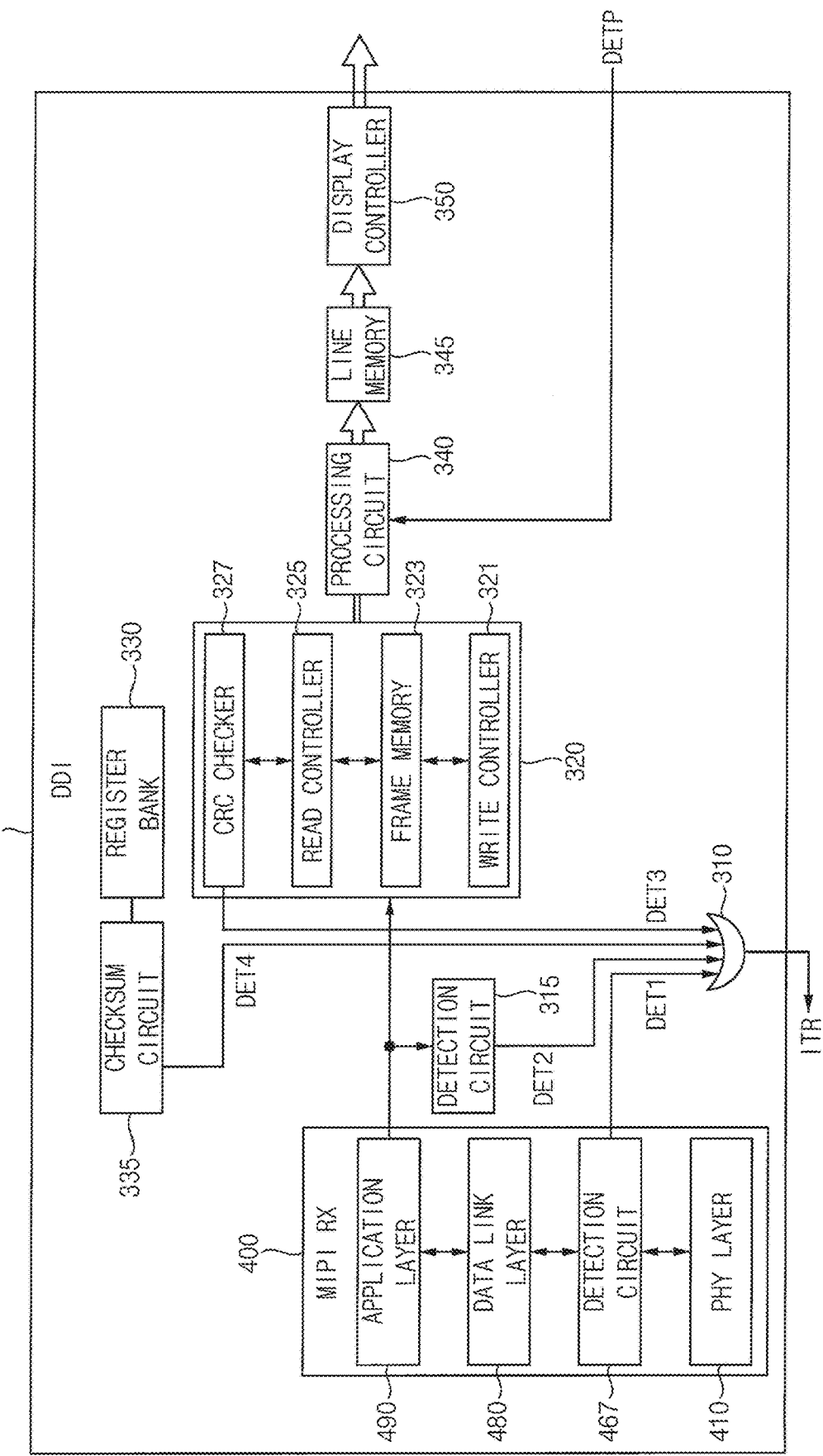
FIG. 7 is a detailed block diagram of the DDI in FIG. 5 according to some example embodiments.

The MIPI RX 400 may include one clock lane module and one or more data lane modules. As illustrated in FIG. 7, each lane module may include the HS-TX, the HS-RX, the LP-TX, the LP-RX, and the LP-CD.

The DDI 300 may transmit display data to the display 500 via a display interface 360. The DDI 300 may be implemented by using a chip, an IC, a processor or the like. The display interface 360 may be implemented, for example, by using an enhanced reduced voltage differential signal transmission (eRVDS) interface for convenience of explanation, but the present disclosure is not limited thereto.

The DDI 300 may re-transmit line data previous to current line data that is being transmitted, to the display 500 in response to an activated event signal (DETP) received from the display 500 via an exclusive (or dedicated) line 361.

The display 500 may include a display panel 510, a reception interface 515, a clock generator DLL 520, and a detector 530. The display panel 510 may display an image corresponding to the display data that is received via the reception interface 515.

The reception interface 515 may transform the display data into a form suitable for the display panel 510. The clock generator 520 may provide a display clock signal DCLK to a processing circuit (not illustrated) capable of processing the display data. For example, the clock generator 520 may be implemented with a phase-locked loop (PLL) or a delay-locked loop (DLL).

The detector 530 may monitor whether the clock generator 520 maintains a lock state, and may generate the activated event signal DETP when the clock generator 520 loses the lock state. For example, when the clock generator 520 is affected by external noise, the clock generator 520 may lose the lock state. The external noise may be transient noise, for example, like an electrostatic discharge (ESD).

FIG. 7 is a detailed block diagram of the DDI in FIG. 5 according to some example embodiments.

Referring to FIGS. 5 and 7, the DDI 300 may include the MIPI RX 400, an interrupt generation circuit 310, a second detection circuit 315, a data processing circuit 320, a register bank 330, a checksum circuit 335, a processing circuit 340, a line memory 345, and the display controller 350.

The DDI 300 may be implemented by using, for example, an IC or a semiconductor chip. The MIPI RX 400 may receive the MIPI clock signal CK and the MIPI data DATA0, DATA1, . . . and the like from the host 200 via the MIPI interface 215. The MIPI RX 400 may transmit MIPI data received via the MIPI interface 215 in a video stream.

The MIPI RX 400 may include a MIPI PHY layer 410, a first detection circuit 467, a MIPI data link layer 480, and a MIPI application layer 490.

Since a structure and a function of each of (or at least one of) the MIPI PHY layer 410, the MIPI data link layer 480, and the MIPI application layer 490 except for the first detection circuit 467 are substantially the same as those of each of (or at least one of) corresponding layers defined in the MIPI specification, a detailed description thereof will be omitted.

The first detection circuit 467 may detect normality or abnormality of the MIPI interface 215 and/or normality or abnormality of the DDI 300, may generate a first detection signal DET1 according to a result of the detection, and may transmit the first detection signal DET1 to the MIPI PHY layer 410 and/or the interrupt generation circuit 310. The normality or abnormality of the MIPI interface 215 and/or the normality or abnormality of the DDI 300 may be determined, for example, according to external noise.

According to some example embodiments, the first detection circuit 467 may be implemented in the same layer as the MIPI PHY layer 410, in the same layer as the MIPI data link layer 480, or between the MIPI PHY layer 410 and the MIPI data link layer 480.

The second detection circuit 315 may analyze data (for example, still image data, moving image data, or a video stream) output by the MIPI RX 400, and may generate a second detection signal DET2 according to a result of the analysis.

The data processing circuit 320 may include a write controller 321, a frame memory 323, a read controller 325, and a cyclic redundancy check (CRC) circuit (CRC checker) 327. The data processing circuit 320 may write the data output by the MIPI RX 400 to a frame memory 323, or may read the data written to the frame memory 323. According to some example embodiments, the data may be, for example, still image data, moving image data, or a video stream.

The write controller 321 may write the data output by the MIPI RX 400 to the frame memory 323.

The read controller 325 may read the data written to the frame memory 323, and may transmit the read data to the processing circuit 340.

According to some example embodiments, the write controller 321 and the read controller 325 may be integrally formed into a controller.

The CRC circuit 327 may perform a CRC on the data (for example, still image data, moving image data, or a video stream) stored in the frame memory 323, and may generate an error detection signal DET3 according to a result of the CRC.

The register bank 330 may store one or more parameters used for an operation of the DDI 300. According some example embodiments, the register bank 330 may be implemented by using a special function register (SFR) or a special purpose register (SPR).

The parameter(s) may include any of various information, such as, for example, information about a frame rate of data which is to be processed by the DDI 300, information about setting of a clock generator (for example, a PLL) implemented in the DDI 300, and/or information about a resolution of the display panel 510.

When the parameter stored in the register bank 330 is changed by external noise, the DDI 300 may not perform a normal operation according to the importance of the parameter.

The checksum circuit 335 may periodically scan (or read) the parameter(s) stored in the register bank 330, and may compare a first checksum currently calculated for the parameter(s) with a second checksum previously calculated for the parameter(s). The checksum circuit 335 may output an activated error detection signal DET4 based on the comparison.

The processing circuit 340 may process the data output by the data processing circuit 320, and may transmit the processed data to the line memory 345.

The processing circuit 340 may control an operation of the line memory 345 in response to the activated event signal DETP output by the display 500 and received via the exclusive (or dedicated) line 361.

The display controller 350 may transmit line data (for example, display data) that is received from the line memory 345 in units of lines, to the reception interface 515 of the display 500 via the display interface 360.

Figure 8:
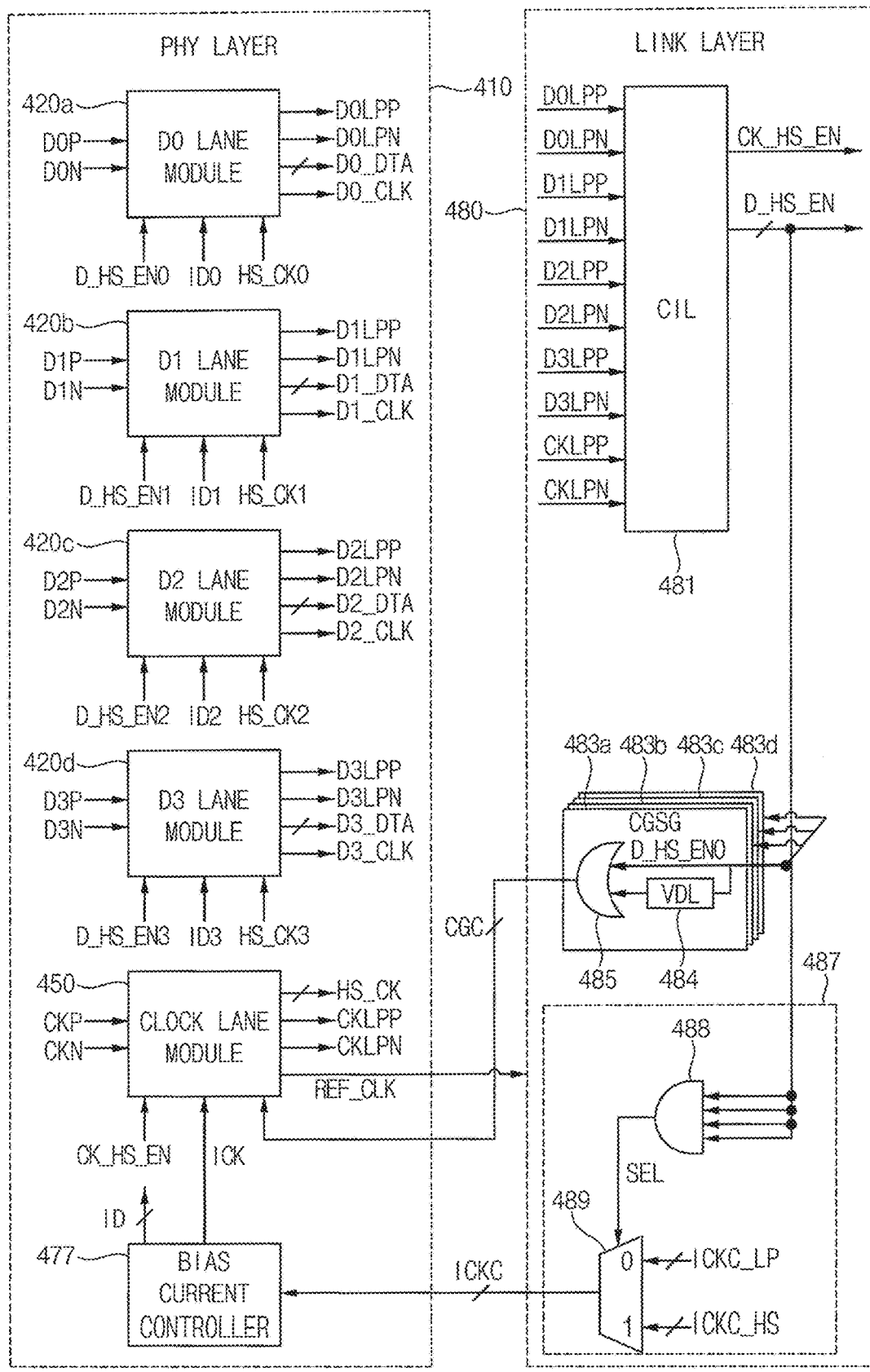
FIG. 8 is a block diagram illustrating a physical (PHY) layer and a link layer in the DDI in FIG. 6 according to some example embodiments.

FIG. 8 is a block diagram illustrating a physical (PHY) layer and a link layer in the DDI in FIG. 6 according to example embodiments.

In FIG. 8, a PHY layer 410 and a link layer 480 may be referred to as a receiver circuit. That is, a receiver circuit may include the PHY layer 410 and the link layer 480.

Referring to FIG. 8, the PHY layer 410 may include a plurality of data lane modules 420a, 420d, 420c and 420d, a clock lane module 450 and a bias current controller 477 and the link layer 480 may include a control and interface logic (CIL) 481, a plurality of clock gating signal generators 483a, 483b, 483c and 483d and a bias signal generator 487.

The data lane module 420a may receive data signals D0P and D0N, may output low power data signals D0LPP and D0LPN in an LP mode and may output a parallel data signal D0_DTA and a data clock signal D0_CLK in an HS mode.

The data lane module 420a may receive a second enable signal D_HS_EN0, a data bias current ID0 and a divided clock signal HS_CK0.

The data lane module 420b may receive data signals D1P and D1N, may output low power data signals D1LPP and D1LPN in the LP mode and may output a parallel data signal D1_DTA and a data clock signal D1_CLK in the HS mode. The data lane module 420b may receive a second enable signal D_HS_EN1, a data bias current ID1 and a divided clock signal HS_CK1.

The data lane module 420c may receive data signals D2P and D2N, may output low power data signals D2LPP and D2LPN in the LP mode and may output a parallel data signal D2_DTA and a data clock signal D2_CLK in the HS mode. The data lane module 420c may receive a second enable signal D_HS_EN2, a data bias current ID2 and a divided clock signal HS_CK2.

The data lane module 420d may receive data signals D3P and D3N, may output low power data signals D3LPP and D3LPN in the LP mode and may output a parallel data signal D3_DTA and a data clock signal D3_CLK in the HS mode. The data lane module 420d may receive a second enable signal D_HS_EN3, a data bias current ID3 and a divided clock signal HS_CK3.

The clock lane module 450 may receive clock signals CKP and CKN, may output low power clock signals CKLPP and CKLPN in the LP mode, may output a high speed clock signal HS_CK in the HS mode, and may generate reference clock signal REF_CLK. The clock lane module 450 may receive a first enable signal CK_HS_EN, a clock bias current ICK and clock gating signals CGC.

The clock signals CKP and CKN and the data signals D0P, D0N, D1P, D1N, D2P, D2N, D3P and D3N may be based on a MIPI D-PHY protocol.

The bias current controller 477 may generate the clock bias current ICK provided to the clock lane module 450 and may adjust a magnitude of the clock bias current ICK based on a bias control signal ICKC. The bias current controller 477 may generate data bias currents ID provided to the plurality of data lane modules 420a, 420d, 420c and 420d.

The link layer 480 may provide the bias control signal ICKC to the bias current controller 477 and may provide the clock gating signals CGC to the clock lane module 450, based on levels of the low power data signals D0LPP, D0LPN, D1LPP, D1LPN, D2LPP, D20LPN, D3LPP and D3LPN output from the plurality of data lane modules 420a, 420d, 420c and 420d and the low power clock signals CKLPP and CKLPN output from the clock lane module 450. The link layer 480 may determine a power mode of the data lane modules 420a, 420d, 420c and 420d and the clock lane module 450 based on the levels of the low power data signals D0LPP, D0LPN, D1LPP, D1LPN, D2LPP, D20LPN, D3LPP and D3LPN and the low power clock signals CKLPP and CKLPN.

The power mode may be divided into a first power mode, a second power mode and a third power mode. In the first power mode, the clock lane module 450 and the plurality of data lane modules 420a, 420d, 420c and 420d operate in the LP mode. In the second power mode, the clock lane module 450 operates in the HS mode and the plurality of data lane modules 420a, 420d, 420c and 420d operate in the LP mode. In the third power mode, the clock lane module 450 and the plurality of data lane modules 420a, 420d, 420c and 420d operate in the HS mode.

The bias current controller 477, based on the bias control signal ICKC, may cut off the clock bias current ICK provided to the clock lane module 450 in the first power mode, may provide the clock bias current ICK having a first magnitude to the clock lane module 450 in the second power mode, and may provide the clock bias current ICK having a second magnitude greater than the first magnitude to the clock lane module 450 in the third power mode. The clock bias current ICK may be referred to as a bias current.

The CIL 481 may generate a first enable signal CK_HS_EN for enabling a termination circuit and a high speed receiver of the clock lane module 450 and second enable signals D_HS_EN for enabling a termination circuit and a high speed receiver of each of (or at least one of) the plurality of data lane modules 420a, 420d, 420c and 420d, based on the low power data signals D0LPP, D0LPN, D1LPP, D1LPN, D2LPP, D20LPN, D3LPP and D3LPN and the low power clock signals CKLPP and CKLPN.

Each of (or at least one of) the plurality of clock gating signal generators 483a, 483b, 483c and 483d may generate the clock gating signals CGC based on respective one of the second enable signals D_HS_EN.

The clock gating signal generator CGSG 483a may include a variable delayer VDL 484 and an OR gate 485. The variable delayer VDL 484 may delay a corresponding enable signal D_HS_EN0 from among the second enable signals D_HS_EN and the OR gate 485 may perform an OR operation on the enable signal D_HS_EN0 and an output of the variable delayer 484 to output a corresponding clock gating signal from among the clock gating signals CGC.

A configuration of the clock gating signal generators 483b, 483c and 483d may substantially the same as a configuration of the clock gating signal generator 483a.

The bias signal generator 487 may generate the bias control signal ICKC based on the second enable signals D_HS_EN. The bias signal generator 487 may generate the bias control signal ICKC such that the clock bias current ICK has the first magnitude in response to the second enable signals D_HS_EN designating the second power mode and the clock bias current ICK has the second magnitude in response to the second enable signals D_HS_EN designating the third power mode.

The bias signal generator 487 may include an AND gate 488 and a multiplexer 489.

The AND gate 488 may output a selection signal SEL by performing an AND operation on the second enable signals D_HS_EN. The multiplexer 489 may receive a first bias control signal ICKC_LP associated with the first magnitude and a second bias control signal ICKC_HS associated with the second magnitude and may output one of a first bias control signal ICKC_LP and the second bias control signal ICKC_HS as the bias control signal ICKC to the bias current controller 477 in response to the selection signal SEL.

Figure 9:
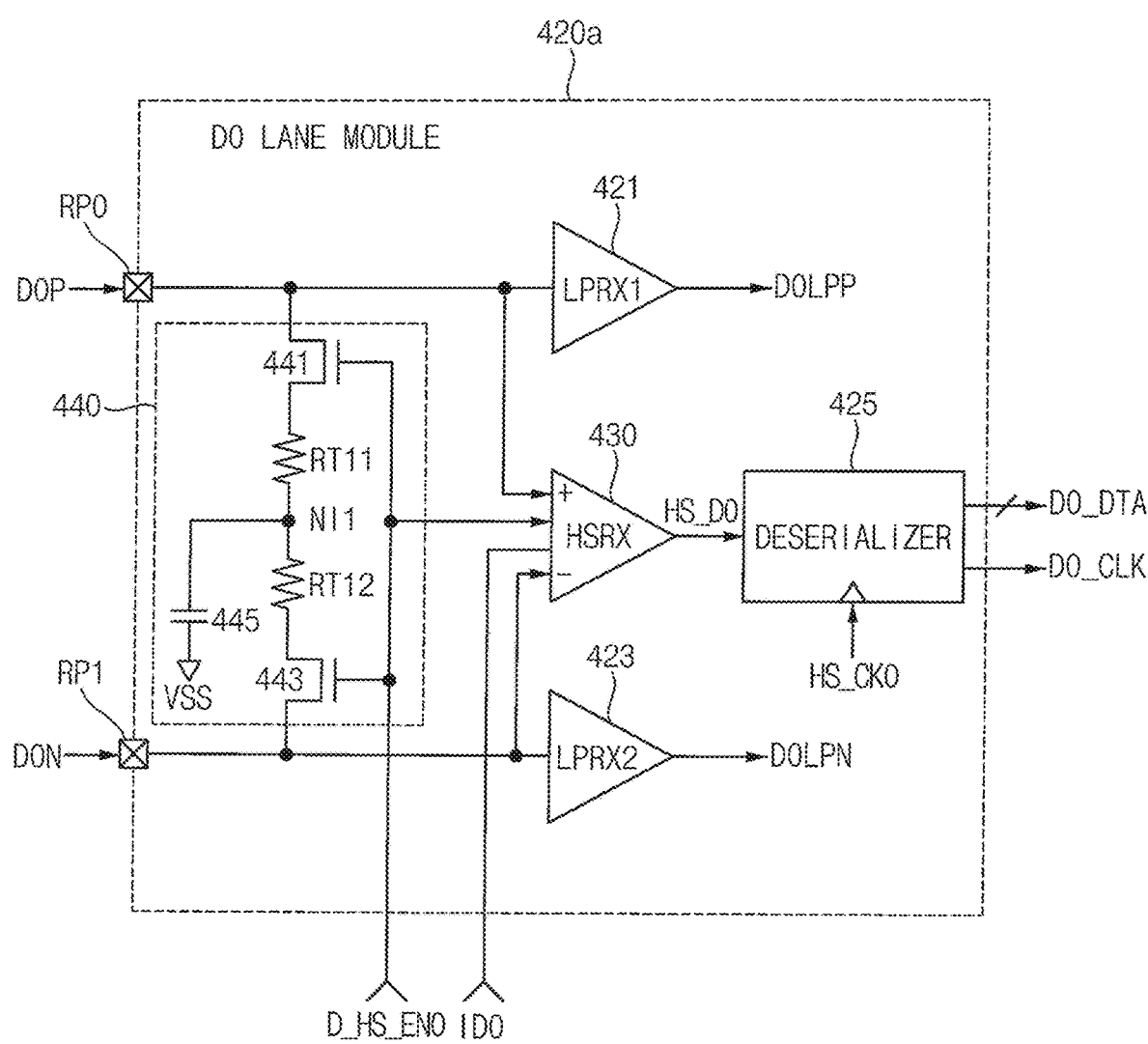
FIG. 9 is a circuit diagram of one of the plurality of data lane modules in the PHY layer in FIG. 8 according to some example embodiments.

FIG. 9 is a circuit diagram of one of the plurality of data lane modules in the PHY layer in FIG. 8 according to some example embodiments.

FIG. 9 illustrates a configuration of the data lane module 420a and each of (or at least one of) the data lane modules 420b, 420c and 420d may have substantially the same configuration as the configuration of the data lane module 420a.

Referring to FIG. 9, the data lane module 420a may include a termination circuit 440, a first receiver LPRX1 421, a second receiver LPRX2 423, a third receiver HSRX 430 and a deserializer 425.

The termination circuit 440 may be connected between a first reception terminal RP0 to receive a first data signal D0P and a second reception terminal RP1 to receive a second data signal D0N.

The first receiver 421 may receive the first data signal D0P to output a first low power data signal D0LPP in the LP mode. The second receiver 423 may receive the second data signal D0N to output a second low power data signal D0LPN in the LP mode.

The third receiver 430 may receive the first data signal D0P and the second data signal D0N and may output a high speed data signal HS_D0 to the deserializer 425 based on the data bias current ID0 in the HS mode.

The termination circuit 440 and the third receiver 430 may be enabled in the HS mode in response to the second enable signal D_HS_EN0.

The deserializer 425, in the HS mode, may parallelize the high speed data signal HS_D0 based on the divided clock signal HS_CK0 to output the parallel data signal D0_DTA and may output the data clock signal D0_CLK.

The termination circuit 440 may include a first transistor 441, a first termination resistor RT11, a second termination resistor RT12 and a second transistor 443 connected in series between the first reception terminal RP0 and the second reception terminal RP1. The termination circuit 440 may further include a capacitor 445.

The first transistor 441 may be connected between the first reception terminal RP0, the first termination resistor RT11 may be connected between the first transistor 441 and a first node N11, the second transistor 443 may be connected to the second reception terminal RP1, the second termination resistor RT12 may be connected between the second transistor 443 and the first node N11 and the capacitor 445 may be connected between the first node N11 and a ground voltage VS S.

Each of (or at least one of) the first transistor 441 and the second transistor 443 may include an n-channel metal-oxide semiconductor (NMOS) transistor that has a gate receiving the second enable signal D_HS_EN0.

When the first transistor 441 and the second transistor 443 are turned-on in response to the second enable signal D_HS_EN0 in the HS mode, the first termination resistor RT11 and the second termination resistor RT12 may be connected in series between the first reception terminal RP0 and the second reception terminal RP1.

Figure 10:
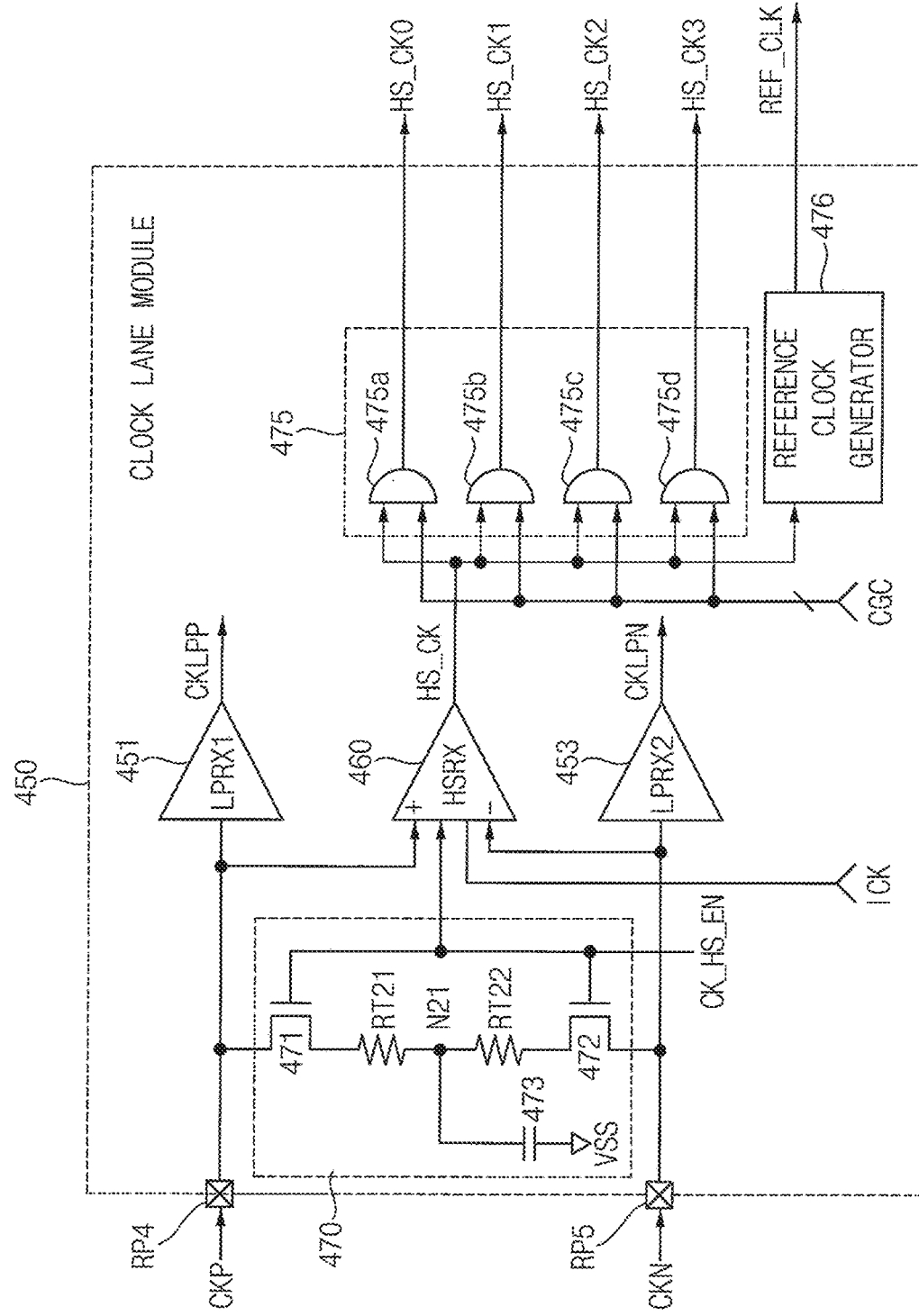
FIG. 10 is a circuit diagram of the clock lane module in the PHY layer in FIG. 8 according to some example embodiments.

FIG. 10 is a circuit diagram of the clock lane module in the PHY layer in FIG. 8 according to some example embodiments.

Referring to FIG. 10, the clock lane module 450 may include a termination circuit 470, a first receiver LPRX1 451, a second receiver LPRX2 453, a third receiver HSRX 460, a divided clock generator 475 and a reference clock generator 476.

The termination circuit 470 may be connected between a first reception terminal RP4 to receive a first clock signal CKP and a second reception terminal RP5 to receive a second clock signal CKN.

The first receiver 451 may receive the first clock signal CKP to output a first low power clock signal CKLPP in the LP mode. The second receiver 453 may receive the second clock signal CKN to output a second low power clock signal CKLPN in the LP mode.

The third receiver 630 may receive the first clock signal CKP and the second clock signal CKN and may output a high speed clock signal HS_CK to the divided clock generator 475 and the reference clock generator 476 based on the clock bias current ICK in the HS mode.

The termination circuit 470 and the third receiver 460 may be enabled in the HS mode in response to the first enable signal HS_EN.

The reference clock generator 476 may generate the reference clock signal REF_CLK based on the high speed clock signal HS_CK.

The termination circuit 470 may include a first transistor 471, a first termination resistor RT21, a second termination resistor RT22 and a second transistor 472 connected in series between the first reception terminal RP4 and the second reception terminal RP5. The termination circuit 470 may further include a capacitor 473.

The first transistor 471 may be connected between the first reception terminal RP4, the first termination resistor RT21 may be connected between the first transistor 471 and a first node N21, the second transistor 472 may be connected to the second reception terminal RP5, the second termination resistor RT22 may be connected between the second transistor 473 and the first node N21 and the capacitor 473 may be connected between the first node N21 and the ground voltage VS S.

Each of (or at least one of) the first transistor 471 and the second transistor 472 may include an NMOS transistor that has a gate receiving the first enable signal CK_HS_EN.

When the first transistor 471 and the second transistor 472 are turned-on in response to the first enable signal CK_HS_EN in the HS mode, the first termination resistor RT21 and the second termination resistor RT22 may be connected in series between the first reception terminal RP4 and the second reception terminal RP5.

The divided clock signal generator 475 may include a plurality of AND gates 475a, 475b, 475c and 475d. Each of (or at least one of) the plurality of AND gates 475a, 475b, 475c and 475d may output respective one of divided clock signals HS_CK0, HS_CK1, HS_CK2 and HS_CK3 by performing an AND operation on the high speed clock signal HS_CK and the clock gating signals CGC. Therefore, the plurality of AND gates 475a, 475b, 475c and 475d may gate the high speed clock signal HS_CK in response to the clock gating signals CGC being a low level in the LP mode and the divided clock signals HS_CK0, HS_CK1, HS_CK2 and HS_CK3 may not toggle in the LP mode.

Figure 11:
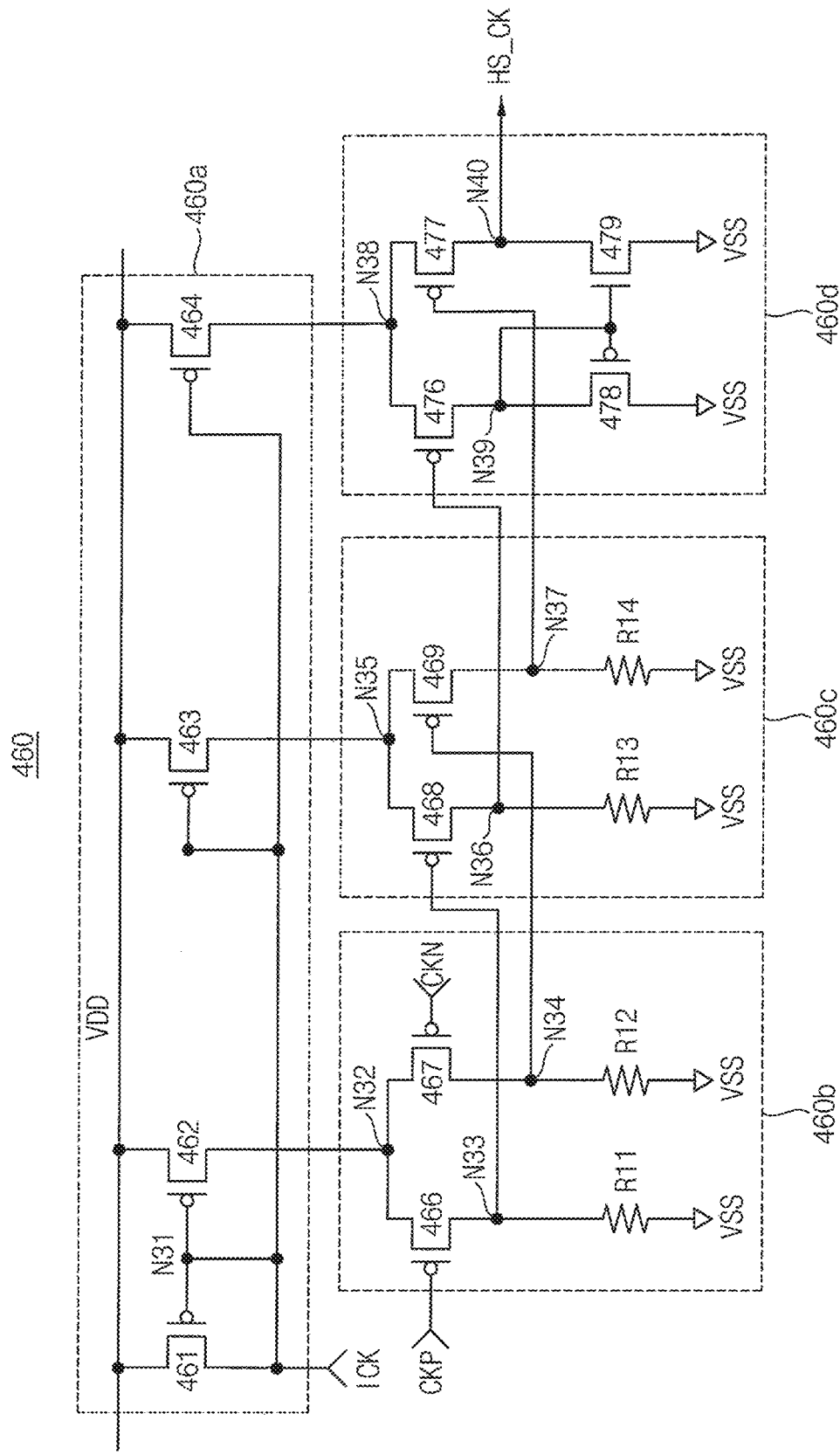
FIG. 11 is a circuit diagram of the third receiver in the clock lane module of FIG. 10 according to some example embodiments.

FIG. 11 is a circuit diagram of the third receiver in the clock lane module of FIG. 10 according to some example embodiments.

Referring to FIG. 11, the third receiver 460 may include a source current generation circuit 460a and at least two amplifying stages 460b, 460c and 460d.

The source current generation circuit 460a may include p-channel metal-oxide semiconductor (PMOS) transistors 461, 462, 463 and 464.

The PMOS transistor 461 may have a source coupled to a power supply voltage VDD, a gate coupled to a first node N31 receiving the clock bias current ICK, and a drain coupled to the first node N31. The PMOS transistor 462 may have a source coupled to the power supply voltage VDD, a gate coupled to the first node N31 and a drain coupled to a second node N32.

The PMOS transistor 463 may have a source coupled to the power supply voltage VDD, a gate coupled to a first node N31, and a drain coupled to a fifth node N35. The PMOS transistor 464 may have a source coupled to the power supply voltage VDD, a gate coupled to the first node N31 and a drain coupled to an eighth node N38.

The amplifying stage 460b may include PMOS transistors 466 and 467 and resistors R11 and R12.

The PMOS transistor 466 may have a source coupled to the second node N32, a gate receiving the first clock signal CKP and a drain coupled to a third node N33. The PMOS transistor 467 may have a source coupled to the second node N32, a gate receiving the second clock signal CKN, and a drain coupled to a fourth node N34. The resistor R11 may be connected between the third node N33 and the ground voltage VSS and the resistor R12 may be connected between the fourth node N34 and the ground voltage VSS.

The amplifying stage 460c may include PMOS transistors 468 and 469 and resistors R13 and R14.

The PMOS transistor 468 may have a source coupled to the fifth node N35, a gate coupled to the third node N33 and a drain coupled to a sixth node N36. The PMOS transistor 469 may have a source coupled to the fifth node N35, a gate coupled to the fourth node N34 and a drain coupled to a seventh node N37. The resistor R13 may be connected between the sixth node N36 and the ground voltage VSS and the resistor R14 may be connected between the seventh node N37 and the ground voltage VSS.

The amplifying stage 460d may include PMOS transistors 476 and 477 and NMOS transistors 478 and 479.

The PMOS transistor 476 may have a source coupled to the eighth node N38, a gate coupled to the sixth node N36 and a drain coupled to a ninth node N39. The PMOS transistor 477 may have a source coupled to the eighth node N38, a gate coupled to the seventh node N37 and a drain coupled to a tenth node N40. The NMOS transistor 478 may have a drain coupled to the ninth node N39, a gate coupled to the ninth node N39 and a source coupled to the ground voltage VSS and the NMOS transistor 478 may have a drain coupled to the tenth node N40, a gate coupled to the ninth node N39 and a source coupled to the ground voltage VSS. The NMOS transistors 478 and 479 may constitute a current mirror and the high speed clock signal HS_CK may be provided at the tenth node N40.

The amplifying stage 460b may amplify a difference between the first clock signal CKP and the second clock signal CKN based on a source current provided at the second node N32, the amplifying stage 460c may amplify a difference between output signals of the amplifying stage 460b based on a source current provided at the fifth node N35 and the amplifying stage 460d may amplify a difference between output signals of the amplifying stage 460c based on a source current provided at the eighth node N38 to output the high speed clock signal HS_CK.

Because each of (or at least one of) the PMOS transistors 462, 463 and 464 may constitute a current mirror with the PMOS transistor 461, and each of (or at least one of) the PMOS transistors 462, 463 and 464 may provide respective one of the second node N32, the fifth node N35 and the eighth node N38 with a source current having a magnitude which is the same as the clock bias current ICK or proportional to the clock bias current ICK. That is, when the clock bias current ICK is adjusted, the source current generation circuit 460a may adjust the source currents provided to the second node N32, the fifth node N35 and the eighth node N38, respectively. Therefore, when the clock bias current ICK having the first magnitude is provided to the source current generation circuit 460a in the second power mode and clock bias current ICK having the second magnitude is provided to the source current generation circuit 460a in the third power mode, the third receiver 460 may generate the high speed clock signal HS_CK based on the clock bias current ICK having different magnitude in the second power mode and the third power mode.

Figure 12:
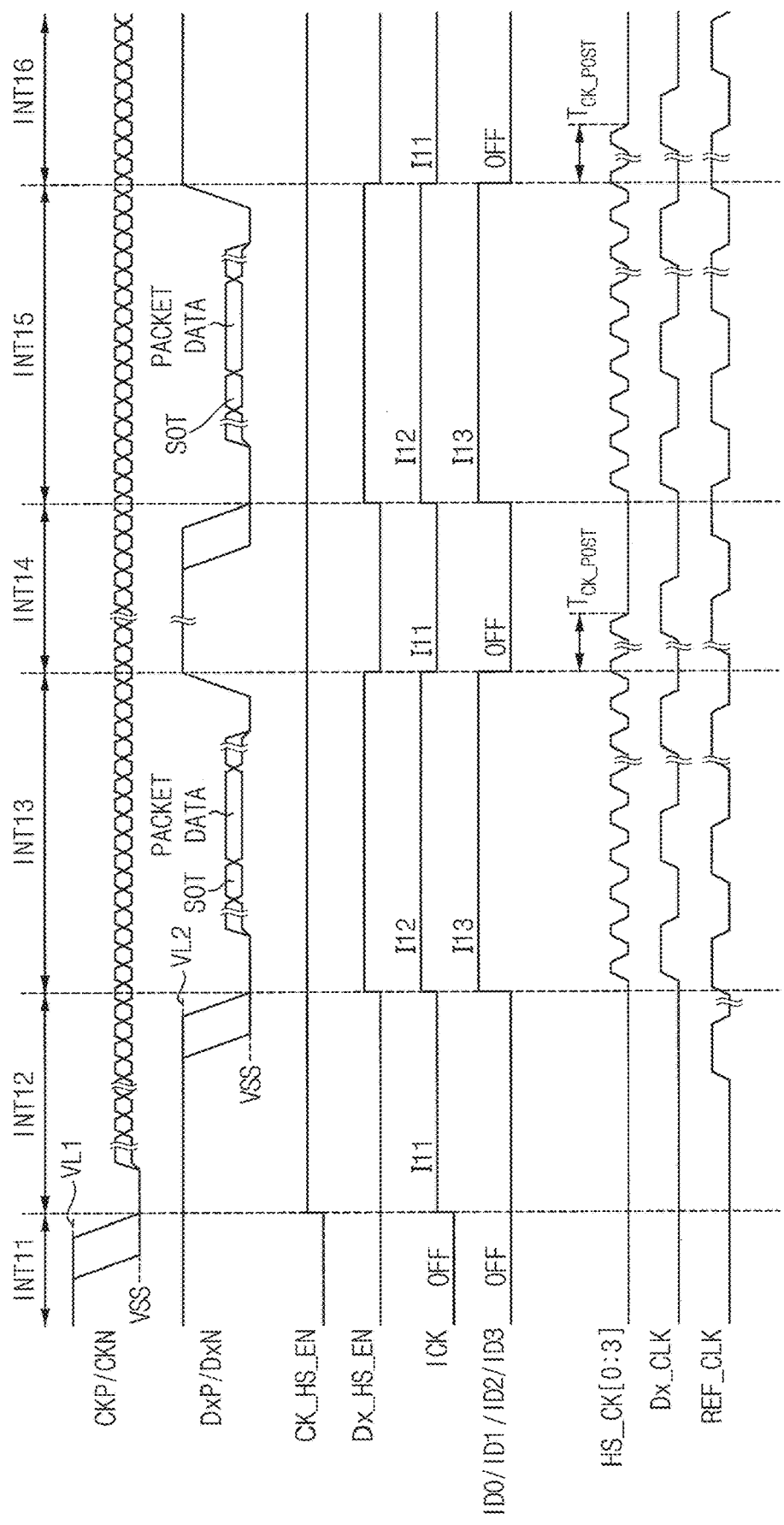
FIG. 12 is a timing diagram illustrating signals of the PHY layer and the link layer of FIG. 8 according to some example embodiments.

FIG. 12 is a timing diagram illustrating signals of the PHY layer and the link layer of FIG. 8 according to some example embodiments.

Referring to FIGS. 8 and 12, during a first interval INT11, the clock lane module 450 and the plurality of data lane modules 420a, 420d, 420c and 420d operate in the LP mode, the clock signals CKP and CKN may swing between the ground voltage VSS and a first voltage level VL1 greater than the ground voltage VSS, and the data signals DxP and DxN may swing between the ground voltage VSS and a second voltage level VL2 greater than the ground voltage VSS. In addition, the first enable signal CH_HS_EN has a low level and the second enable signals Dx_HS_EN have a low level, the clock bias current ICK is cut off and data bias currents are cut off. The divided clock signals HS_CK[0:3] and the data clock signals Dx_CLK do not toggle.

During a second interval INT12, the clock lane module 450 operates in the HS mode and the plurality of data lane modules 420a, 420d, 420c and 420d operate in the LP mode, the clock signals CKP and CKN may swing between a voltage level greater than the ground voltage VSS and a voltage level smaller than first voltage level VL1, and the data signals DxP and DxN may swing between the ground voltage VSS and the second voltage level VL2. In addition, the first enable signal CH_HS_EN is activated with a high level and the second enable signals Dx_HS_EN have a low level, the clock bias current ICK has a first magnitude I11 and data bias currents are cut off. The divided clock signals HS_CK[0:3] and the data clock signals Dx_CLK do not toggle and the reference clock signal REF_CLK starts to toggle.

During a third interval INT13, the clock lane module 450 operates in the HS mode and the plurality of data lane modules 420a, 420d, 420c and 420d operate in the HS mode, the clock signals CKP and CKN may swing between a voltage level greater than the ground voltage VSS and a voltage level smaller than first voltage level VL1, and a packet data may be transmitted through the data signals DxP and DxN. SOT denotes a start of the transmitted packet. In addition, the first enable signal CH_HS_EN is maintained with a high level and the second enable signals Dx_HS_EN are activated with a high level, the clock bias current ICK has a second magnitude I12 greater than the first magnitude I11 and data bias currents have a third magnitude I13 which is substantially the same as the second magnitude I12. The divided clock signals HS_CK[0:3], the data clock signals Dx_CLK and the reference clock signal REF_CLK toggle with respective frequencies.

Operation within a fourth interval INT14 is similar with the operation with the second interval INT12 and the divided clock signals HS_CK[0:3] toggle during an interval $T_{CK\_POST}$ required for recovering the packet data and stop toggling.

Operation within a fifth interval INT15 is substantially the same as the operation within the third interval INT13 and operation within a sixth interval INT16 is substantially the same as the operation within the fourth interval INT14.

Figure 13:
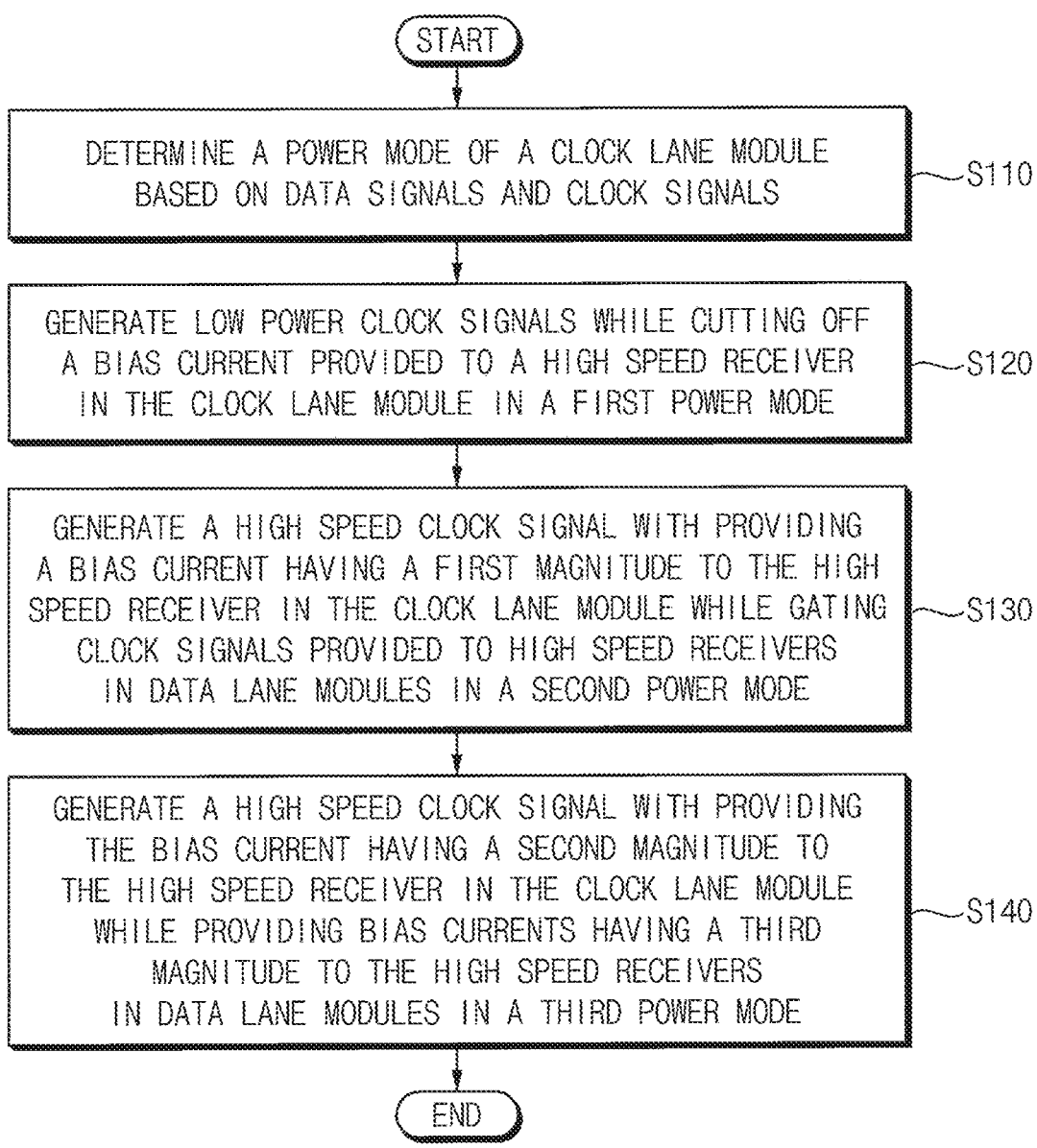
FIG. 13 is a flow chart illustrating a method of operating a receiver circuit according to some example embodiments.

FIG. 13 is a flow chart illustrating a method of operating a receiver circuit according to some example embodiments.

Referring to FIGS. 8 through 13, the link layer 480 may determine a power mode of the data lane modules 420a, 420d, 420c and 420d and the clock lane module 450 based on the levels of the low power data signals D0LPP, D0LPN, D1LPP, D1LPN, D2LPP, D20LPN, D3LPP and D3LPN and the low power clock signals CKLPP and CKLPN (operation S110).

In the first power mode, the clock lane module 450 generates the low power clock signals CKLPP and CKLPN and the bias current controller 477 cuts off the clock bias current ICK provided to the clock lane module 450 (operation S120). In the second power mode, the clock lane module 450 generates the high speed clock signal HS_CK and the bias current controller 477 provides the clock bias current ICK having the first magnitude to the clock lane module 450 while gating clock signals provided to a high speed receiver in each of (or at least one of) the data lane modules 420a, 420d, 420c and 420d (operation S130).

In the third power mode, the clock lane module 450 generates the high speed clock signal HS_CK and the bias current controller 477 provides the clock bias current ICK having the second magnitude to the clock lane module 450 while providing a data bias current having a third magnitude to a high speed receiver in each of (or at least one of) the data lane modules 420a, 420d, 420c and 420d (operation S140).

Figure 14:
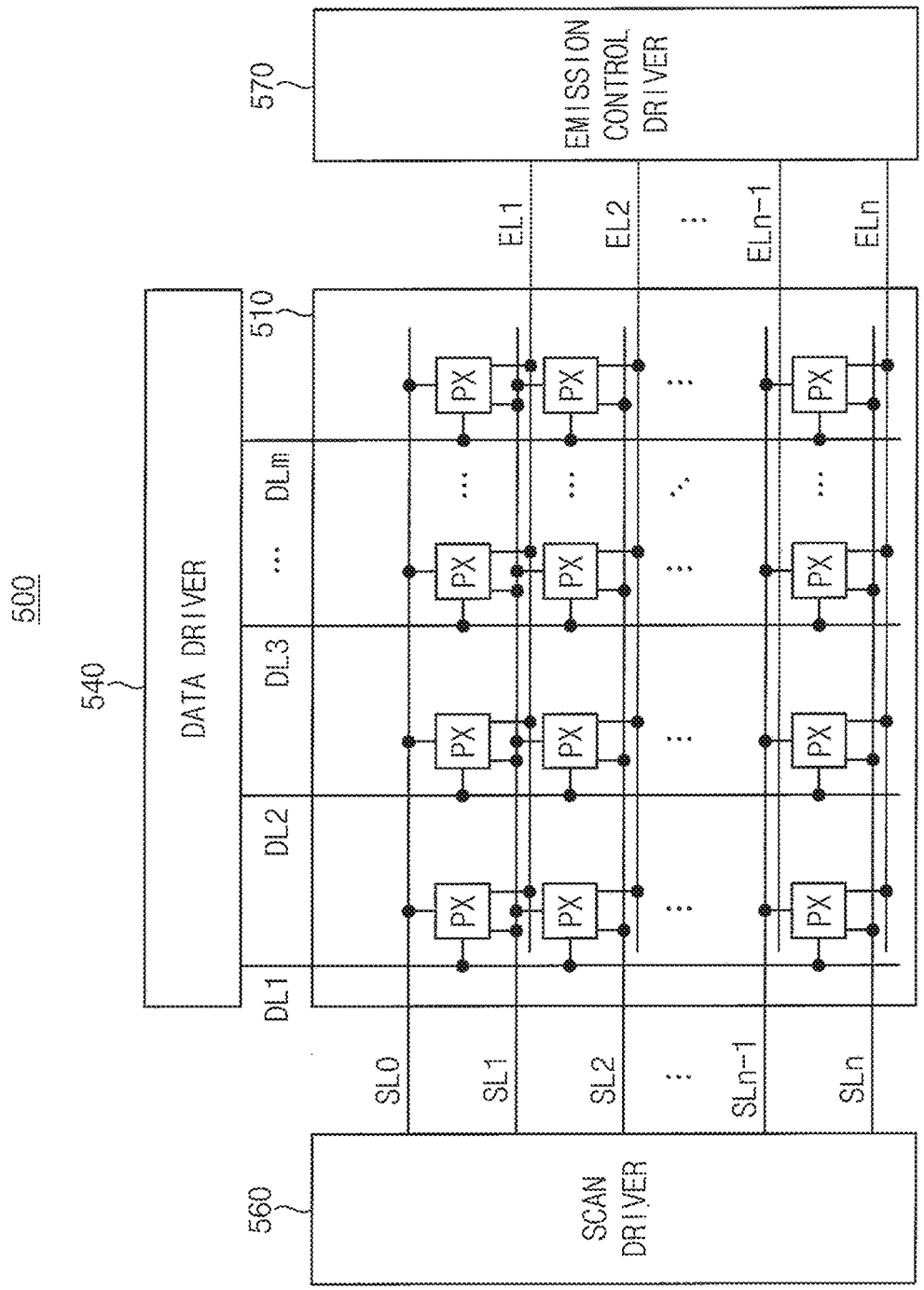
FIG. 14 is a block diagram illustrating an example of the display in the display system of FIG. 5 according to some example embodiments.

FIG. 14 is a block diagram illustrating an example of the display in the display system of FIG. 5 according to some example embodiments.

An organic light emitting diode (OLED) display will be described as an example of a display panel 510 will be described.

Referring to FIG. 14, the display 500 may include a display panel 510, a data driver 540, a scan driver 560 and an emission control driver 570.

The display panel 510 may include a plurality of data lines DL1 to DLm, a plurality of scan lines SL0 to SLn, a plurality of emission control lines EL1 to ELn, and a plurality of pixels PX arranged among the lines. The plurality of pixels PX may be respectively connected to the corresponding scan lines SL, data lines DL, and emission control lines EL. Here, each of m and n is an integer greater than 3.

The plurality of pixels PX may output light components of predetermined (or alternatively, desired) colors. Two or more pixels PX (for example, red, blue, and green pixels) that are arranged in the same line or adjacent lines and output light components of different colors may configure one unit pixel. The two or more pixels PX that configure the unit pixel may be referred to as sub-pixels. The display panel 510 may have an RGB structure in which the red, blue, and green pixels configure one unit pixel. In an example, the display panel 510 may have an RGBW structure in which the unit pixel further includes a white pixel for improving brightness. In another example embodiment, the unit pixel of the display panel 510 may be configured by a combination of pixels of other colors than the red, green, and blue colors.

The scan driver 560 may be connected to the plurality of scan lines SL0 and SL1 and sequentially selects the pixels PX by sequentially applying scan signals to the pixels PX in units of lines.

The emission control driver 570 may be connected to the plurality of emission control lines EL1 to ELn and may control emission time of the pixels PX by sequentially applying the plurality of emission signals via the control lines EL1 to ELn to the pixels PX.

The data driver 540 may generate the plurality of image signals and may provide the plurality of image signals to the pixels PX through the plurality of data lines DL1 to DLm.

Figure 15:
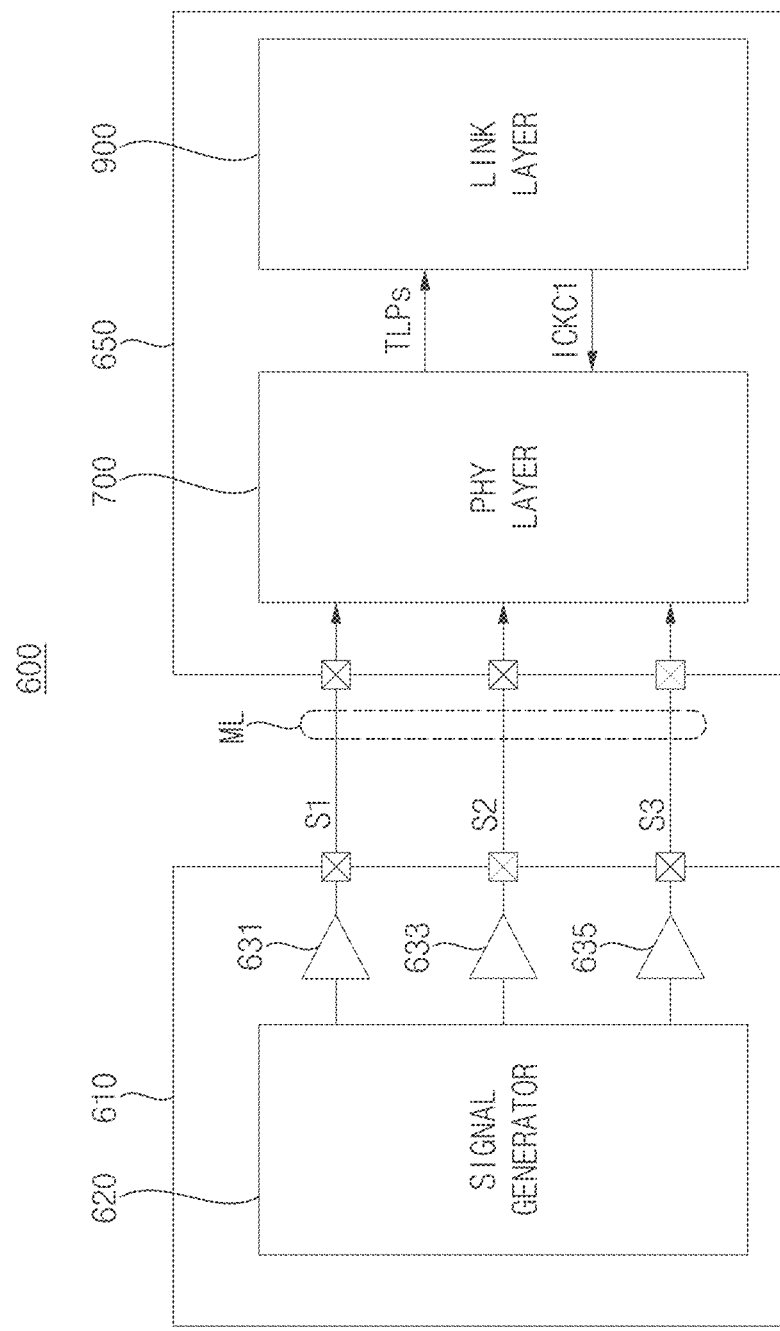
FIG. 15 illustrates an electronic device according to some example embodiments.

FIG. 15 illustrates an electronic device according to some example embodiments.

Referring to FIG. 15, an electronic device 600 may include a transmitter circuit 610 and a receiver circuit 650.

The transmitter circuit 610 may include signal generator 620, a first transmitter 631, a second transmitter 633, and a third transmitter 635. The signal generator 620 may generate three or more signals S1, S2, and S3. The first transmitter 631, the second transmitter 633, and the third transmitter 635 may output the signals S1, S2, and S3 through communication lines ML. Each of (or at least one of) the signals S1, S2, and S3 may have a communication line. For example, in this example embodiment, there may be three or more communication lines.

The first transmitter 631, the second transmitter 633, and the third transmitter 635 may transmit signals in compliance with one of various communication protocols. For example, first transmitter 631, the second transmitter 633, and the third transmitter 635 may transmit signals in compliance with a protocol, for example the C-PHY protocol defined by the MIPI. However, example embodiments of the present disclosure are not limited thereto. For example, the transmitter circuit 610 and a receiver circuit 650 may comply with the physical layer specifications and interface protocols associated with communication through three or more communication lines.

The receiver circuit 650 may receive the signals S1, S2, and S3 through the communication lines ML. The receiver circuit 650 may include a PHY layer 700 and a link layer 900. The PHY layer 700 may provide low power signals TLPs to the link layer 900 based on the signals S1, S2, and S3 and the link layer 900 may provide a bias control signal ICKC1 to the PHY layer 700 based on the low power signals TLPs.

Figure 16:
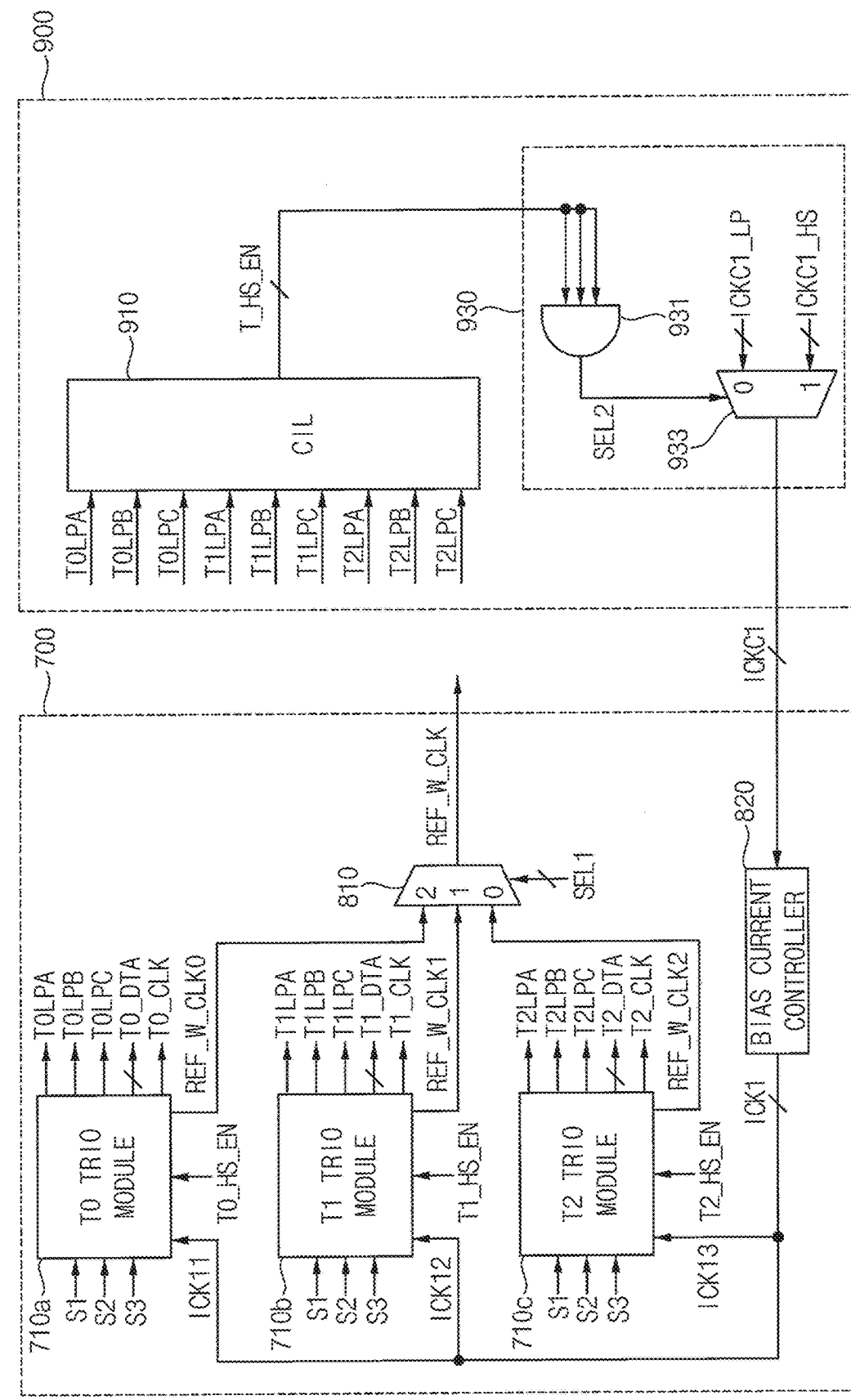
FIG. 16 illustrates a configuration of the receiver circuit in the electronic device of FIG. 15 according to some example embodiments.

FIG. 16 illustrates a configuration of the receiver circuit in the electronic device of FIG. 15 according to some example embodiments.

Referring to FIG. 16, the receiver circuit 650 may include the PHY layer 700 and the link layer 900, and the PHY layer 700 may include a plurality of trio modules 710a, 710b and 710c, a selection circuit 810 and a bias current controller 820.

The trio module T0 TRIO MODULE 710a may receive the signals S1, S2 and S3, may output low power signals T0LPA, T0LPB and T0LPC in the LP mode and may output a parallel data signal T0_DTA, a data clock signal T0_CLK and a reference clock signal REF_W_CLK0 in the HS mode. The trio module 710a may receive a high speed mode enable signal T0_HS_EN and a bias current ICK11.

The trio module T1 TRIO MODULE 710b may receive the signals S1, S2 and S3, may output low power signals T1LPA, T1LPB and T1LPC in the LP mode and may output a parallel data signal T1_DTA, a data clock signal T1_CLK and a reference clock signal REF_W_CLK1 in the HS mode. The trio module 710b may receive a high speed mode enable signal T1_HS_EN and a bias current ICK12.

The trio module T2 TRIO MODULE 710c may receive the signals S1, S2 and S3, may output low power signals T2LPA, T2LPB and T2LPC in the LP mode and may output a parallel data signal T2_DTA, a data clock signal T2_CLK and a reference clock signal REF_W_CLK2 in the HS mode. The trio module 710c may receive a high speed mode enable signal T2_HS_EN and a bias current ICK13.

The selection circuit 810 may receive the reference clock signals REF_W_CLK0, REF_W_CLK1 and REF_W_CLK2 and may output one of the reference clock signals REF_W_CLK0, REF_W_CLK1 and REF_W_CLK2 as a reference clock signal REF_W_CLK to the link layer 900, in response to a first selection signal SEL1.

The signals S1, S2 and S3 may be based on the MIPI C-PHY protocol.

The bias current controller 820 may generate the bias current ICK1 provided to the trio modules 710a, 710b and 710c and may adjust a magnitude of the bias current ICK1 based on the bias control signal ICKC1. The bias current ICK1 may include bias currents ICK11, ICK12 and ICK13 that are provided to the trio modules 710a, 710b and 710c, respectively.

The link layer 900 may provide the bias control signal ICKC1 to the bias current controller 820 based in levels of the low power signals T0LPA, T0LPB, T0LPC, T1LPA, T1LPB, T1LPC, T2LPA, T2LPB and T2LPC. The link layer 900 may determine a power mode of the trio modules 710a, 710b and 710c based on the levels of the low power signals T0LPA, T0LPB, T0LPC, T1LPA, T1LPB, T1LPC, T2LPA, T2LPB and T2LPC.

The power mode may be divided into a first power mode, a second power mode and a third power mode. In the first power mode, the trio modules 710a, 710b and 710c may operate in the LP mode. In the second power mode, one (for example, a first trio module 710a) of the trio modules 710a, 710b and 710c may operate in the HS mode and remaining trio modules (for example, the trio modules 710b and 710c) of the trio modules 710a, 710b and 710c may operate in the LP mode. In the third power mode, the trio modules 710a, 710b and 710c may operate in the HS mode.

The bias current controller 820, based on the bias control signal ICKC1, may cut off the bias currents ICK1 provided to the trio modules 710a, 710b and 710c in the first power mode, may provide the first trio module 710a with the bias current ICK11 having a first magnitude in the second power mode and may provide the first trio module 710a with the bias current ICK11 having a second magnitude greater than the first magnitude in the third power mode.

The link layer 900 may include a control and interface logic (CIL) 910 and a bias signal generator 930.

The CIL 910 may generate high speed mode enable signals T_HS_EN for enabling a termination circuit and a high speed receiver of each of (or at least one of) the trio modules 710a, 710b and 710c, based on the low power signals T0LPA, T0LPB, T0LPC, T1LPA, T1LPB, T1LPC, T2LPA, T2LPB and T2LPC, and may provide the high speed mode enable signals T_HS_EN to the trio modules 710a, 710b and 710c and the bias signal generator 930.

The bias signal generator 930 may generate the bias control signal ICKC1 based on the high speed mode enable signals T_HS_EN. The bias signal generator 930 may generate the bias control signal ICKC1 such that the bias current ICK11 has the first magnitude in response to the high speed mode enable signals T_HS_EN designating the second power mode and the bias current ICK11 has the second magnitude in response to the high speed mode enable signals T_HS_EN designating the third power mode.

The bias signal generator 930 may include an AND gate 931 and a multiplexer 933.

The AND gate 931 may output a second selection signal SEL2 by performing an AND operation on the high speed mode enable signals T_HS_EN. The multiplexer 933 may receive a first bias control signal ICKC1-LP associated with the first magnitude and a second bias control signal ICKC1_HS associated with the second magnitude and may output one of a first bias control signal ICKC1_LP and the second bias control signal ICKC1_HS as the bias control signal ICKC1 to the bias current controller 820 in response to the second selection signal SEL2.

Figure 17:
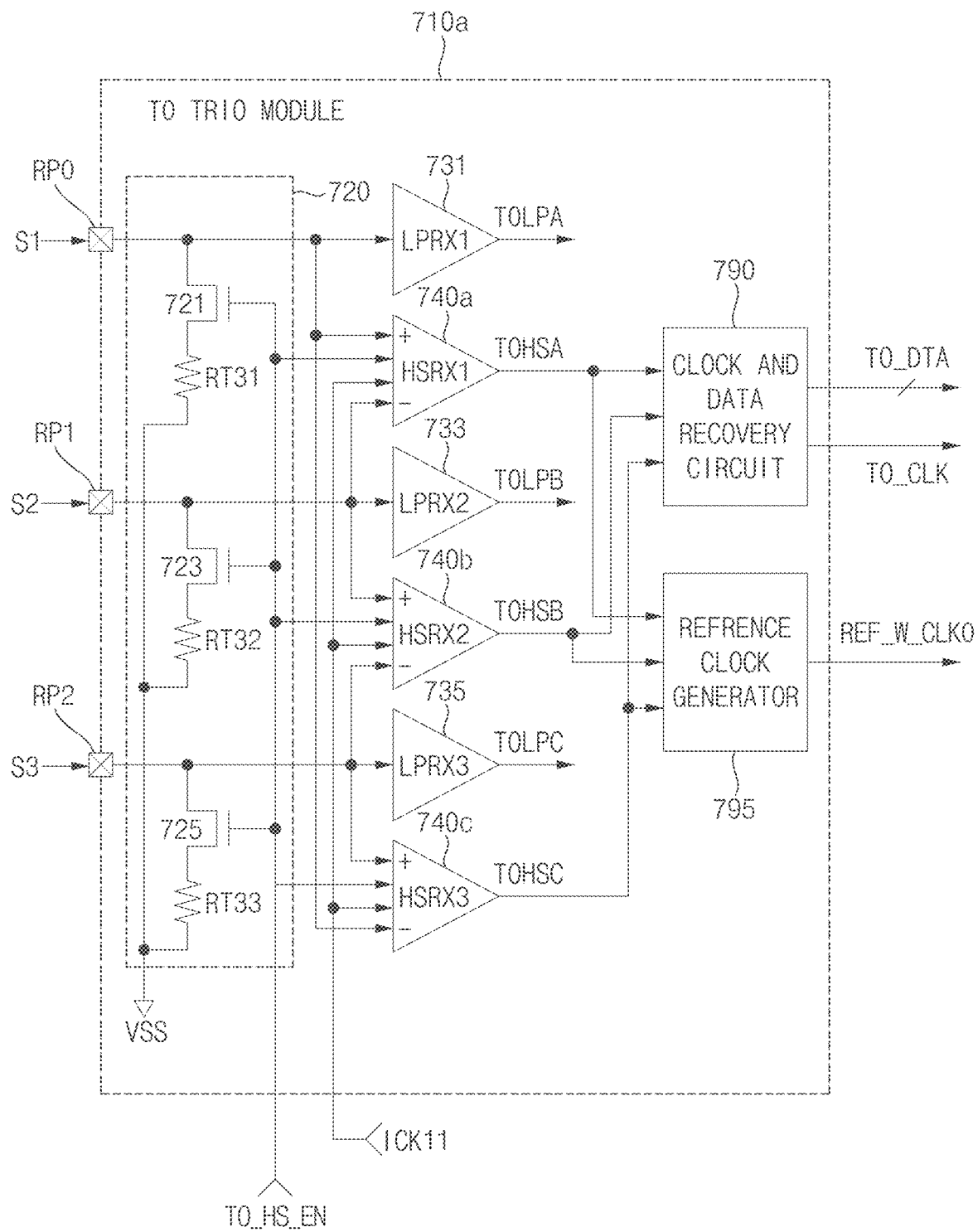
FIG. 17 is a circuit diagram of one of the trio modules in the PHY layer in FIG. 16 according to some example embodiments.

FIG. 17 is a circuit diagram of one of the trio modules in the PHY layer in FIG. 16 according to some example embodiments.

FIG. 17 illustrates a configuration of the trio module 710a and each of (or at least one of) the trio modules 710b and 710c may have substantially the same configuration as the configuration of the trio module 710a.

Referring to FIG. 17, the trio module 710a may include a termination circuit 720, a first low power receiver LPRX1 731, a second low power receiver LPRX2 733, a third low power receiver LPRX3 735, a first high speed receiver HSRX1 740a, a second high speed receiver HSRX2 740b, a third high speed receiver HSRX3 740c, a clock and data recovery circuit 790 and a reference clock generator 795.

The termination circuit 720 may be connected to a first reception terminal RP0 to receive the first signal S1, a second reception terminal RP1 to receive the second signal S2 and a third reception terminal RP2 to receive the third signal S3.

The first low power receiver 731 may receive the first signal S1 to output a first low power signal T0LPA in the LP mode. The second low power receiver 733 may receive the second signal S2 to output a second low power signal T0LPB in the LP mode. The third low power receiver 735 may receive the third signal S3 to output a third low power signal T0LPC in the LP mode.

The first high speed receiver 740a may receive the first signal S1 and the second signal S2, and may amplifying a difference between the first signal S1 and the second signal S2 based on the bias current ICK11 to output a first high speed signal T0HSA in the HS mode. The second high speed receiver 740b may receive the second signal S2 and the third signal S3, and may amplifying a difference between the second signal S2 and the third signal S3 based on the bias current ICK11 to output a second high speed signal T0HSB in the HS mode. The third high speed receiver 740c may receive the third signal S3 and the first signal S1, and may amplifying a difference between the third signal S3 and the first signal S1 based on the bias current ICK11 to output a third high speed signal T0HSC in the HS mode.

The termination circuit 720 and the first through third high speed receivers 740a, 740b and 740c may be enabled in the HS mode in response to the high speed enable signal T0_HS_EN.

The clock and data recovery circuit 790 may recover the parallel data signal T0_DTA and the data clock signal T0_CLK based on the first through third high speed signals T0HSA, T0HSB and T0HSC.

The reference clock generator 795 may generate the reference clock signal REF_W_CLK0 based on the first through third high speed signals T0HSA, T0HSB and T0HSC.

The termination circuit 720 may include transistors 721, 723 and 725 and termination resistors RT31, RT32 and RT33.

The transistor 721 may be connected to the first reception terminal RP0 and may have a gate receiving the high speed mode enable signal T0_HS_EN. The termination resistor RT31 may be connected between the transistor 721 and the ground voltage VSS. The transistor 723 may be connected to the second reception terminal RP1 and may have a gate receiving the high speed mode enable signal T0_HS_EN. The termination resistor RT32 may be connected between the transistor 723 and the ground voltage VSS. The transistor 725 may be connected to the third reception terminal RP2 and may have a gate receiving the high speed mode enable signal T0_HS_EN. The termination resistor RT33 may be connected between the transistor 725 and the ground voltage VSS.

When the transistors are turned-on in response to the high speed mode enable signal T0_HS_EN, each of (or at least one of) the termination resistors RT31, RT32 and RT33 may be connected between respective one of the reception terminals RP0, RP1 and RP2 and the ground voltage VSS.

Figure 18:
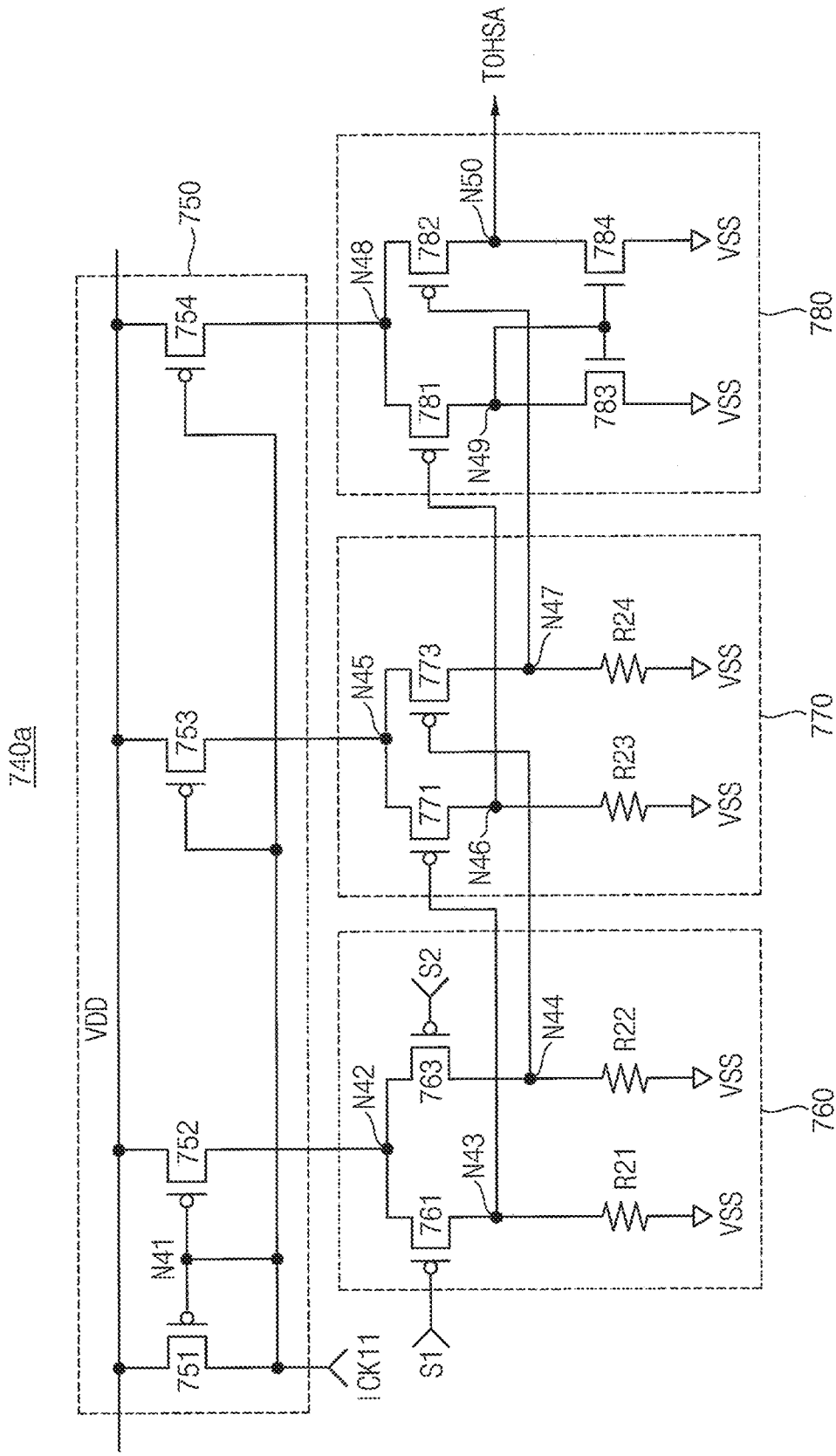
FIG. 18 is a circuit diagram of the first high speed receiver in the trio module of FIG. 17 according to some example embodiments.

FIG. 18 is a circuit diagram of the first high speed receiver in the trio module of FIG. 17 according to some example embodiments.

FIG. 18 illustrates a configuration of the first high speed receiver 740a and each of (or at least one of) the second and third high speed receivers 740b and 740c may have substantially the same configuration as the configuration of the first high speed receiver 740a.

Referring to FIG. 18, the first high speed receiver 740a may include a source current generation circuit 750 and at least two amplifying stages 760, 770 and 780.

The source current generation circuit 750 may include PMOS transistors 751, 752, 753 and 754.

The PMOS transistor 751 may have a source coupled to the power supply voltage VDD, a gate coupled to a first node N41 receiving the clock bias current ICK11, and a drain coupled to the first node N41. The PMOS transistor 752 may have a source coupled to the power supply voltage VDD, a gate coupled to the first node N41 and a drain coupled to a second node N42.

The PMOS transistor 753 may have a source coupled to the power supply voltage VDD, a gate coupled to a first node N41 and a drain coupled to a fifth node N45. The PMOS transistor 754 may have a source coupled to the power supply voltage VDD, a gate coupled to the first node N41 and a drain coupled to an eighth node N48.

The amplifying stage 760 may include PMOS transistors 761 and 763 and resistors R21 and R22.

The PMOS transistor 761 may have a source coupled to the second node N42, a gate receiving the first signal S1 and a drain coupled to a third node N43. The PMOS transistor 763 may have a source coupled to the second node N42, a gate receiving the second signal S2 and a drain coupled to a fourth node N44. The resistor R21 may be connected between the third node N43 and the ground voltage VSS and the resistor R22 may be connected between the fourth node N44 and the ground voltage VSS.

The amplifying stage 770 may include PMOS transistors 771 and 773 and resistors R23 and R24.

The PMOS transistor 771 may have a source coupled to the fifth node N45, a gate coupled to the third node N43 and a drain coupled to a sixth node N46. The PMOS transistor 773 may have a source coupled to the fifth node N45, a gate coupled to the fourth node N44 and a drain coupled to a seventh node N47. The resistor R23 may be connected between the sixth node N46 and the ground voltage VSS and the resistor R24 may be connected between the seventh node N47 and the ground voltage VSS.

The amplifying stage 780 may include PMOS transistors 781 and 782 and NMOS transistors 783 and 784.

The PMOS transistor 781 may have a source coupled to the eighth node N48, a gate coupled to the sixth node N46 and a drain coupled to a ninth node N49. The PMOS transistor 782 may have a source coupled to the eighth node N48, a gate coupled to the seventh node N47 and a drain coupled to a tenth node N50. The NMOS transistor 783 may have a drain coupled to the ninth node N49, a gate coupled to the ninth node N49 and a source coupled to the ground voltage VSS and the NMOS transistor 784 may have a drain coupled to the tenth node N50, a gate coupled to the ninth node N49 and a source coupled to the ground voltage VSS. The NMOS transistors 783 and 784 may constitute a current mirror and the first high speed signal T0HSA may be provided at the tenth node N50.

The amplifying stage 760 may amplify a difference between the first signal S1 and the second signal S2 based on a source current provided at the second node N42, the amplifying stage 770 may amplify a difference between output signals of the amplifying stage 760 based on a source current provided at the fifth node N45 and the amplifying stage 780 may amplify a difference between output signals of the amplifying stage 770 based on a source current provided at the eighth node N48 to output the first high speed signal T0HSA.

Because each of (or at least one of) the PMOS transistors 752, 753 and 754 may constitute a current mirror with the PMOS transistor 751, and each of (or at least one of) the PMOS transistors 752, 753 and 754 may provide respective one of the second node N42, the fifth node N45 and the eighth node N48 with a source current having a magnitude which is the same as the bias current ICK11 or proportional to the bias current ICK11. That is, when the bias current ICK11 is adjusted, the source current generation circuit 750 may adjust the source currents provided to the second node N42, the fifth node N45 and the eighth node N48, respectively. Therefore, when the bias current ICK11 having the first magnitude is provided to the source current generation circuit 750 in the second power mode and bias current ICK11 having the second magnitude is provided to the source current generation circuit 750 in the third power mode, the first high speed receiver 740a may generate first high speed signal T0HSA based on the bias current ICK11 having different magnitude in the second power mode and the third power mode.

Figure 19:
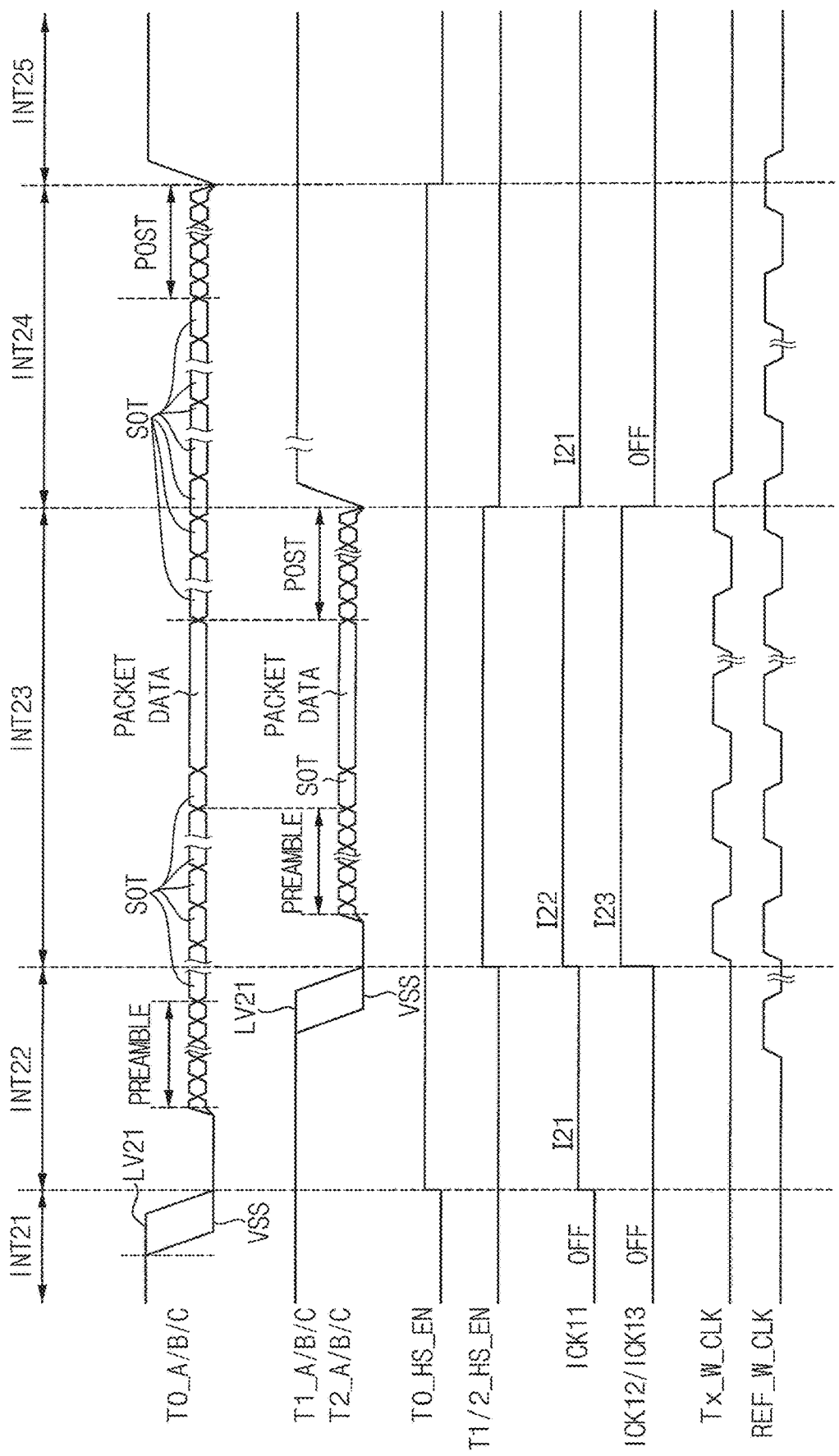
FIG. 19 is a timing diagram illustrating signals of the PHY layer and the link layer in FIG. 16 according to some example embodiments.

FIG. 19 is a timing diagram illustrating signals of the PHY layer and the link layer in FIG. 16 according to some example embodiments.

Referring to FIGS. 16 and 19, during a first interval INT21, the trio modules 710a, 710b and 710c operate in the LP mode, and signals T0_A/B/C and signals T1_A/B/C and T2_A/B/C may swing between the ground voltage VSS and a first voltage level VL21 greater than the ground voltage VSS. In addition, the high speed enable signals T0_HS_EN, T1_HS_EN and T2_HS_EN have a low level the bias currents ICK11, ICK12 and ICK13 are cut off. In addition, data clock signals Tx_W_CLK and the reference clock signal REF_W_CLK do not toggle.

During a second interval INT22, the trio module 710a operates in the HS mode and the trio modules 710b and 710c operate in the LP mode and the signals T0_A/B/C may swing between a voltage level greater than the ground voltage VSS and a voltage level smaller than first voltage level VL21 to transmit a preamble and a SOT. The signals T1_A/B/C and T2_A/B/C may swing between the ground voltage VS S and the first voltage level VL21. In addition, the high speed enable signal T0_HS_EN have a high level, the high speed enable signals T1_HS_EN and T2_HS_EN have a low level, the bias current ICK11 has a first magnitude I21 and the bias currents ICK12 and ICK13 are cut off. In addition, data clock signals Tx_W_CLK do not toggle and the reference clock signal REF_W_CLK starts toggling.

During a third interval INT23, the trio modules 710a, 710b and 710c operate in the HS mode and the signals T0_A/B/C may swing between a voltage level greater than the ground voltage VSS and a voltage level smaller than first voltage level VL21 to transmit a preamble, the SOT and a packet data. The signals T1_A/B/C and T2_A/B/C may swing between a voltage level greater than the ground voltage VSS and a voltage level smaller than first voltage level VL21 to transmit a preamble, the SOT, a packet data and a post amble POST. In addition, the high speed enable signals T0_HS_EN, T1_HS_EN and T2_HS_EN have a high level, the bias current ICK11 has a second magnitude I22 and the bias currents ICK12 and ICK13 have a third magnitude 123. In addition, data clock signals Tx_W_CLK and the reference clock signal REF_W_CLK toggle with respective frequencies.

Operation within a fourth interval INT24 is similar with the operation with the second interval INT22 and the signals T0_A/B/C may swing between a voltage level greater than the ground voltage VSS and a voltage level smaller than first voltage level VL21 to transmit the SOT and the poet amble.

Operation within a fifth interval INT25 is substantially the same as the operation within the first interval INT21.

Therefore, the receiver circuit or the electronic device conforming to MIPI D-PHY protocol or MIPI D-PHY protocol, in a second power mode in which only a clock lane module operates in a high speed mode, provides a clock bias current having a first magnitude to a high speed receiver in the clock lane module and gates high speed clock signals provided to high speed receivers in data lane modules and in a third power mode in which the clock lane module and the data lane modules operate in the high speed mode, provides the clock bias current having a second magnitude greater than the first magnitude to the high speed receiver in the clock lane module and provides the high speed receivers in the data lane modules a data bias current having a third magnitude which is the same as the second magnitude. Accordingly, the receiver circuit or the electronic device may reduce power consumption in the second power mode and reduce a skew between the clock lane module and the data lane modules.

Figure 20:
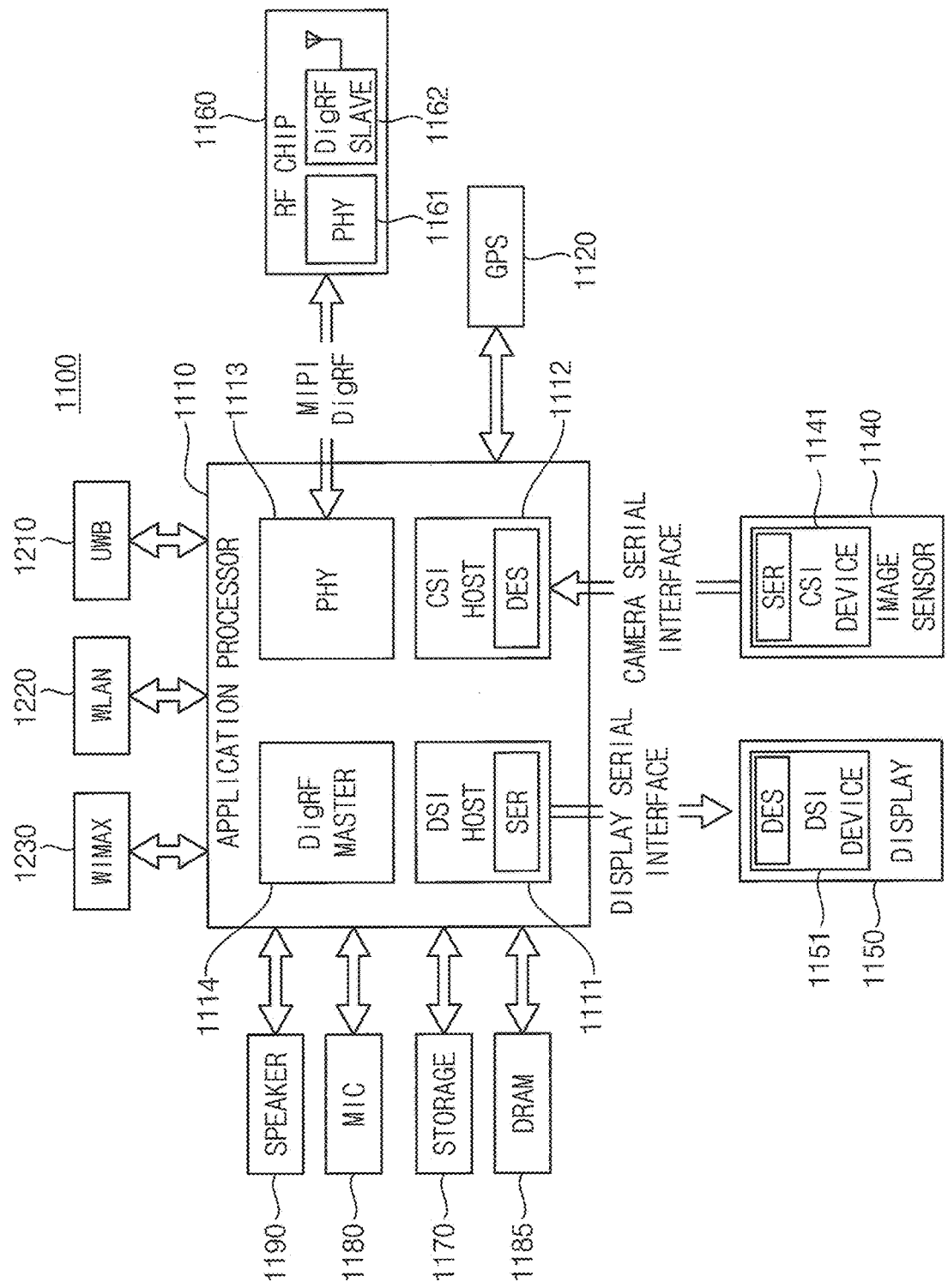
FIG. 20 is a block diagram illustrating an example of an interface employable in a computing system according to some example embodiments.

FIG. 20 is a block diagram illustrating an example of an interface employable in a computing system according to some example embodiments.

Referring to FIG. 20, a computing system 1100 may be implemented by a data processing device that uses or supports a MIPI interface. The computing system 1100 may include an application processor 1110, an image sensor 1140, a display device 1150, etc. A CSI host 1112 of the application processor 1110 may perform a serial communication with a CSI device 1141 of the image sensor 1140 via a camera serial interface (CSI). In some example embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some example embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 and DigRF SLAVE 1162 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra-wideband (UWB) 1210, a wireless local area network (WLAN) 1220, a worldwide interoperability for microwave access (WIMAX) 1130, etc. However, the structure and the interface of the computing system 1100 are not limited thereto.

Example embodiments are not necessarily mutually exclusive. For example, some example embodiments may include one or more features described with reference to one or more figures, and may also include one or more other features described with reference to one or more other figures.

Any of the elements and/or functional blocks disclosed above may include or be implemented in processing circuitry such as hardware including logic circuits; a hardware/software combination such as a processor executing software; or a combination thereof. For example, the data processing circuit 240, display controller 350, lane control and interface logic, read controller 325, write controller 321, processing circuit 340, bias current controller 477, signal generator 620, clock and data recovery circuit 790, DSI device 1151, CSI device 1141, and application processor 1110 may be implemented by processing circuitry which may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims.

What is claimed is:
1. A receiver circuit comprising:
a plurality of data lane modules, each of the plurality of data lane modules configured to receive respective data signals;
a clock lane module configured to receive clock signals and configured to provide each of the plurality of data lane modules with a respective divided clock signal among divided clock signals based on the clock signals;
a bias current controller configured to control a clock bias current provided to the clock lane module; and
a link layer configured to provide a bias control signal to the bias current controller and configured to provide clock gating signals to the clock lane module based on levels of low power data signals output from the plurality of data lane modules and low power clock signals output from the clock lane module, and
wherein the bias current controller, based on the bias control signal, is configured to
cut off the clock bias current in a first power mode,
provide the clock bias current having a first magnitude to the clock lane module in a second power mode, and
provide the clock bias current having a second magnitude greater than the first magnitude to the clock lane module in a third power mode.

2. The receiver circuit of claim 1,
wherein the link layer is configured to determine a power mode of the clock lane module and the plurality of data lane modules as one of the first power mode, the second power mode and the third power mode based on the levels of the low power data signals and the low power clock signals, and
wherein the clock lane module is configured to, in the second power mode, generate the divided clock signals provided to the plurality of data lane modules based on the clock gating signals.

3. The receiver circuit of claim 2, wherein:
in the first power mode, the clock lane module and the plurality of data lane modules operate in a low power mode;
in the second power mode, the clock lane module operates in a high speed mode and the plurality of data lane modules operate in the low power mode; and
in the third power mode, the clock lane module and the plurality of data lane modules operate in the high speed mode.

4. The receiver circuit of claim 3, wherein:
in the low power mode, the received clock signals swing between a ground voltage and a first voltage level greater than the ground voltage;
in the high speed mode, the received clock signals swings between a voltage level greater than the ground voltage and a voltage level less than the first voltage level;
in the low power mode, each of the low power data signals swings between the ground voltage and a second voltage level greater than the ground voltage; and
in the high speed mode, the data signals include packet data when both the clock lane module and the plurality of data lane modules operate in the high speed mode.

5. The receiver circuit of claim 1, wherein the clock lane module includes:
a termination circuit connected between a first reception terminal and a second reception terminal, the termination circuit configured to receive a first clock signal of the clock signals via the first reception terminal, and the termination circuit configured to receive a second clock signal of the clock signals via the second reception terminal;
a first receiver configured to receive the first clock signal and output a first low power clock signal based on the first clock signal;
a second receiver configured to receive the second clock signal and output a second low power clock signal based on the second clock signal;
a third receiver configured to receive the first clock signal and the second clock signal and output a high speed clock signal based on the first clock signal and the second clock signal;
a reference clock generator configured to generate a reference clock signal based on the high speed clock signal and to provide the reference clock signal to the link layer; and
a divided clock signal generator configured to generate the divided clock signals based on the high speed clock signal.

6. The receiver circuit of claim 5,
wherein the link layer is configured to enable the termination circuit and the third receiver in both the second power mode and the third power mode,
wherein the termination circuit includes:
a first transistor connected to the first reception terminal;

a first termination resistor connected between the first transistor and a first node;
a second transistor connected to the second reception terminal;
a second termination resistor connected between the second transistor and the first node; and
a capacitor coupled between the first node and a ground voltage.

7. The receiver circuit of claim 6, wherein the first transistor and the second transistor are configured to be turned-on in either of the second power mode and the third power mode, in response to a first enable signal.

8. The receiver circuit of claim 5, wherein the divided clock signal generator includes a plurality of AND gates configured to perform AND operations on the high speed clock signal and the clock gating signals to output the divided clock signals, respectively.

9. The receiver circuit of claim 5, wherein the third receiver includes:
a source current generation circuit connected to a power supply voltage, the source current generation circuit configured to receive the clock bias current and configured to generate at least one source current corresponding to the clock bias current; and
at least two amplifying stages including
a first amplifier stage configured to receive the first clock signal and the second clock signal and to amplify a difference between the first clock signal and the second clock signal based on the at least one source current, and
a second amplifier stage configured to output the high speed clock signal.

10. The receiver circuit of claim 1, wherein each of the plurality of data lane modules includes:
a termination circuit connected between a first reception terminal and a second reception terminal, the termination circuit configured to receive a first data signal of the data signals via the first reception terminal and receive a second data signal of the data signals via the second reception terminal;
a first receiver configured to receive the first data signal and output a first low power data signal based on the first data signal;
a second receiver configured to receive the second data signal and output a second low power data signal based on the second data signal;
a third receiver configured to receive the first data signal and the second data signal and output a high speed data signal based on the first data signal and the second data signal; and
a deserializer configured to output a parallel data signal by deserializing the high speed data signal based on the respective divided clock signal.

11. The receiver circuit of claim 1, wherein the link layer includes:
a control and interface logic configured to generate a first enable signal and second enable signals based on the low power data signals and the low power clock signals, the first enable signal being for enabling a termination circuit and a high speed receiver of the clock lane module, the second enable signal being for enabling the termination circuit and the high speed receiver of each of the plurality of data lane modules;
a plurality of clock gating signal generators configured to generate the clock gating signals based on the second enable signals; and a bias signal generator configured to generate the bias control signal based on the second enable signals, and
wherein the bias signal generator is configured to generate the bias control signal such that,
the clock bias current has the first magnitude in response to the second enable signals designating the second power mode, and
the clock bias current has the second magnitude in response to the second enable signals designating the third power mode.

12. The receiver circuit of claim 11, wherein the bias signal generator includes:
an AND gate configured to output a selection signal by performing an AND operation on the second enable signals; and
a multiplexer configured to output one of a first bias control signal associated with the first magnitude and a second bias control signal associated with the second magnitude as the bias control signal in response to the selection signal.

13. The receiver circuit of claim 1, wherein the clock signals and the data signals are based on a mobile industry processor interface (MIPI) D-PHY protocol.

14. A receiver circuit comprising:
a plurality of trio modules, each of the trio modules configured to receive three or more signals;
a bias current controller configured to control a bias current provided to each of the plurality of trio modules; and
a link layer configured to provide a bias control signal to the bias current controller based on levels of low power signals output from the plurality of trio modules, wherein
the bias current controller, based on the bias control signal, is configured to:
cut off the bias current in a first power mode;
output the bias current having a first magnitude in a second power mode; and
output the bias current having a second magnitude in a third power mode.

15. The receiver circuit of claim 14, wherein
the link layer is configured to determine a power mode of the plurality of trio modules as one of the first power mode, the second power mode and the third power mode based on the levels of the low power signals, and
in the first power mode, the plurality of trio modules operate in a low power mode;
in the second power mode, a first trio module from among the plurality of trio modules operates in the low power mode and other trio modules from among the plurality of trio modules operate in a high speed mode; and
in the third power mode, the plurality of trio modules operate in the high speed mode.

16. The receiver circuit of claim 15, wherein each of the plurality of trio modules includes:
a termination circuit connected to a first reception terminal, a second reception terminal, and a third reception terminal, the termination circuit is configured to receive a first signal from among the three or more signals via the first reception terminal, receive a second signal from among the three or more signals via the second reception terminal, and receive a third signal from among the three or more signals via the third reception terminal;
a first low power receiver configured to receive the first signal and output a first low power signal based on the first signal;
a second low power receiver configured to receive the second signal and output a second low power signal based on the second signal;
a third low power receiver configured to receive the third signal and output a third low power signal based on the third signal;
a first high speed receiver configured to receive the first signal and the second signal and output a first high speed signal by amplifying a difference between the first signal and the second signal;
a second high speed receiver configured to receive the second signal and the third signal and output a second high speed signal by amplifying a difference between the second signal and the third signal;
a third high speed receiver configured to receive the third signal and the first signal and output a third high speed signal by amplifying a difference between the third signal and the first signal;
a clock and data recovery circuit configured to recover a data signal and a data clock signal based on the first high speed signal, the second high speed signal and the third high speed signal; and
a reference clock generator configured to generate a reference clock signal based on the first high speed signal, the second high speed signal and the third high speed signal.

17. The receiver circuit of claim 16, wherein the link layer is configured to:
in the second power mode, enable the first through third high speed receivers and the termination circuit of the first trio module and disable the first through third high speed receivers and the termination circuit of each of the remaining trio modules; and
in the third power mode, enable the first through third high speed receivers and the termination circuit of each of the plurality of trio modules.

18. The receiver circuit of claim 14, wherein
the link layer includes:
a control and interface logic generate enable signals for enabling a termination circuit and high speed receivers of each of the plurality of trio modules based on the levels of the low power signals; and
a bias signal generator configured to generate the bias control signal based on the enable signals, and
the bias signal generator is configured to generate the bias control signal such that:
the bias current has the first magnitude in response to the enable signals designating the second power mode; and
the bias current has the second magnitude in response to the enable signals designating the third power mode.

19. The receiver circuit of claim 14, wherein the three or more signals are based on a mobile industry processor interface (MIPI)C-PHY protocol.

20. A receiver circuit comprising:
a plurality of data lane modules, each of the plurality of data lane modules configured to receive respective data signals;
a clock lane module configured to receive clock signals and configured to provide each of the plurality of data lane modules with a respective divided clock signal among divided clock signals based on the clock signals;
a bias current controller configured to control a clock bias current provided to the clock lane module; and
a link layer configured to provide a bias control signal to the bias current controller and configured to provide clock gating signals to the clock lane module, based on a power mode of the clock lane module and the plurality of data lane modules, the power mode being determined based on levels of low power data signals output from the plurality of data lane modules and low power clock signals output from the clock lane module, wherein the bias current controller, based on the bias control signal, is configured to:
  cut off the clock bias current in a first power mode;
  provide the clock bias current having a first magnitude to the clock lane module in a second power mode; and
  provide the clock bias current having a second magnitude greater than the first magnitude to the clock lane module in a third power mode, wherein in the second power mode, the clock lane module is configured to generate the divided clock signals provided to the plurality of data lane modules based on the clock gating signals, and wherein in the second power mode, the clock lane module operates in a high speed mode and the plurality of data lane modules operate in a low power mode.

* * * * *